US 6,649,976 B2

(12) United States Patent
Iwamatsu et al.

(10) Patent No.: US 6,649,976 B2
(45) Date of Patent: Nov. 18, 2003

(54) SEMICONDUCTOR DEVICE HAVING METAL SILICIDE FILM AND MANUFACTURING METHOD THEREOF

(75) Inventors: Toshiaki Iwamatsu, Hyogo (JP); Yasuo Inoue, Hyogo (JP); Yasuo Yamaguchi, Hyogo (JP); Tadashi Nishimura, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/982,777

(22) Filed: Oct. 22, 2001

(65) Prior Publication Data

US 2002/0048919 A1 Apr. 25, 2002

Related U.S. Application Data

(63) Continuation of application No. 09/499,733, filed on Feb. 8, 2000, now Pat. No. 6,319,805, which is a division of application No. 08/855,259, filed on May 13, 1997, now Pat. No. 6,051,494, which is a division of application No. 08/614,256, filed on Mar. 12, 1996, now Pat. No. 5,659,194, which is a continuation of application No. 08/378,752, filed on Jan. 26, 1995, now abandoned.

(30) Foreign Application Priority Data

Jan. 28, 1994 (JP) .................................................. 6-8840

(51) Int. Cl.[7] .............................................. H01L 29/76
(52) U.S. Cl. ........................ 257/344; 257/336; 257/344; 257/377; 257/382; 257/384; 257/408; 257/412; 257/413
(58) Field of Search ................................. 257/336, 344, 257/408, 384, 412–413, 382, 377

(56) References Cited

U.S. PATENT DOCUMENTS

| 3,887,993 | A | | 6/1975 | Okada et al. | |
|---|---|---|---|---|---|
| 4,532,609 | A | | 7/1985 | Iizuka | |
| 4,638,347 | A | | 1/1987 | Iyer | |
| 4,683,645 | A | | 8/1987 | Naguib et al. | |
| 4,873,557 | A | * | 10/1989 | Kita | 257/344 |
| 4,874,714 | A | | 10/1989 | Eklund | |
| 4,877,755 | A | | 10/1989 | Rodder | |
| 4,914,500 | A | * | 4/1990 | Liu et al. | 257/384 |
| 4,925,807 | A | * | 5/1990 | Yoshikawa | 438/304 |
| 5,040,037 | A | | 8/1991 | Yamaguchi et al. | |
| 5,102,815 | A | * | 4/1992 | Sanchez | 438/305 |
| 5,145,798 | A | * | 9/1992 | Smayling et al. | 438/305 |
| 5,146,309 | A | * | 9/1992 | Spinner et al. | 257/383 |
| 5,223,456 | A | | 6/1993 | Malwah | |
| 5,294,822 | A | | 3/1994 | Verrett | |
| 5,323,053 | A | * | 6/1994 | Luryi et al. | 257/485 |
| 5,341,028 | A | | 8/1994 | Yamaguchi et al. | |
| 5,342,798 | A | * | 8/1994 | Huang | 438/286 |
| 5,413,969 | A | | 5/1995 | Huang | |
| 5,444,024 | A | | 8/1995 | Anjum et al. | |
| 5,463,238 | A | | 10/1995 | Takahashi et al. | |
| 5,710,438 | A | | 1/1998 | Oda et al. | |

FOREIGN PATENT DOCUMENTS

| JP | 59-110115 | 6/1984 |
|---|---|---|
| JP | 64-757 | 1/1989 |
| JP | 2-159767 | 6/1990 |
| JP | 2-278728 | 11/1990 |
| JP | 4-245642 | 9/1992 |
| JP | 5-36632 | 2/1993 |

* cited by examiner

Primary Examiner—Amir Zarabian
Assistant Examiner—Ida M. Soward
(74) Attorney, Agent, or Firm—McDermott, Will & Emery

(57) ABSTRACT

A semiconductor device in which parasitic resistance of source/drain regions can be reduced than the parasitic resistance of the drain region, and manufacturing method thereof, can be obtained. In the semiconductor device, inactivating ions are implanted only to the source region of the semiconductor layer, so as to damage the crystal near the surface of the semiconductor layer, whereby siliciding reaction is promoted. Therefore, in the source region, a titanium silicide film which is thicker can be formed.

4 Claims, 20 Drawing Sheets

RATIO OF SILICON LAYER CONSUMED
BY SILICIDATION WITH RESPECT TO
SOI FILM THICKNESS (%)
[FROM FIGS 8&9]

NMOS TRANSISTOR
FORMING REGION

PMOS TRANSISTOR
FORMING REGION

SEMICONDUCTOR DEVICE HAVING METAL SILICIDE FILM AND MANUFACTURING METHOD THEREOF

This application is a continuation of application Ser. No. 09/499,733 filed Feb. 8, 2000, now U.S. Pat. No. 6,319,805, which is divisional of application Ser. No. 08/855,259 filed May. 13, 1997, now U.S. Pat. No. 6,051,494, which is a divisional of application Ser. No. 08/614,256, filed Mar. 12, 1996, now U.S. Pat. No. 5,659,194, which is a continuation of application Ser. No. 08/378,752, filed Jan. 26, 1995, now abandoned.

BACKGROUND OF THE INVENTION

1. Field of the Invention

The present invention relates to a semiconductor device including an MOS transistor and manufacturing method thereof. More specifically, the present invention relates to a semiconductor device having a metal silicide film for reducing resistance in source/drain regions, and to manufacturing method thereof.

2. Description of the Background Art

In order to improve performance and speed of operation of a semiconductor device, lower resistance and lower capacitance of interconnections have been pursued. As means for reducing resistance, a technique for forming a metal silicide film on a surface of source/drain regions of an MOS transistor has been developed. In the following, an N channel MOS transistor (hereinafter referred to as an NMOS transistor) will be described as an example, for convenience.

FIG. 34 is a cross section showing a conventional MOS transistor. Referring to FIG. 34, on a main surface of a silicon substrate 1, element isolating oxide films 2 are formed selectively. In an active region surrounded by element isolating oxide film 2 on the main surface of silicon substrate 1, N⁻ source/drain regions 7, 7 are formed, space by a prescribed distance to sandwich a channel region therebetween. N⁻ source/drain regions 7 and N⁺ source/ regions 8 provide source/drain regions having LDD structure. On the channel region, a gate electrode 4 of polycrystalline silicon film is formed with a gate insulating film 3 posed therebetween. On gate electrode 4, a tungsten silicide ($WSi_2$) film 5 is formed in order to reduce resistance of gate electrode 4. An oxide film 6 is formed to cover gate electrode 4 and tungsten silicide film 5. On N⁺ source/drain regions 8, a titanium silicide ($TiSi_2$) film 9 for reducing resistance of N⁺ source/drain regions 8 is formed. An interlayer insulating film 10 is formed to cover the entire surface, and contact holes are provided at prescribed regions of interlayer insulating film 10. An aluminum interconnection 11 is formed in the contact hole to be electrically connected to titanium silicide film 9.

When a circuit having a prescribed function is to be formed by arranging MOS transistors such as described above on one chip, an MOS transistor having a desired resistance value is formed by setting the thicknesses of tungsten silicide film 5 and titanium silicide film 9 to desired values.

FIG. 35 is a cross section showing another conventional MOS transistor. Referring to FIG. 35, different from the conventional MOS transistor shown in FIG. 34, in this another MOS transistor, the silicide film formed on gate electrode 4 is the same silicide film as the titanium silicide film 9 formed on N⁺ source/drain regions 8.

FIG. 36 is a cross section showing a still further conventional MOS transistor. Referring to FIG. 36, the MOS transistor is formed on an SOI substrate. The SOI substrate refers to a structure which includes an insulating layer inside the silicon substrate and a single-crystal silicon layer on the insulating layer. When a semiconductor element such as MOS transistor is formed on the SOI substrate, the speed of operation of the apparatus can be increased and short channel effect can be suppressed, because of reduced parasitic capacitance and increased current driveability. The structure including the MOS transistor formed on the SOI substrate will be referred to as an SOI/MOS transistor. Referring to FIG. 36, in the SOI/MOS transistor, a buried oxide film 12 is formed on silicon substrate 1. On the buried oxide film 12, a single-crystal silicon layer (hereinafter referred to as an SOI layer) 13 is formed.

FIG. 37 is a cross section showing still further conventional SOI/MOS transistor. Referring to FIG. 37, in this example, titanium silicide film 9 formed on N⁺ source/drain regions 8 is also formed on gate electrode 4.

Now, when a circuit having a prescribed function is to be provided by arranging the bulk MOS transistor such as shown in FIGS. 34 and 35 or SOI-MOS transistor such as shown in FIGS. 36 and 37, the MOS transistor having a desired resistance value is formed by setting the thicknesses of tungsten silicide film 5 and titanium silicide film 9 in accordance with the circuit characteristic. More specifically, when the resistance value of gate electrode 4 should be different from the resistance value of N⁺ source/drain regions 8, in the above described conventional examples, tungsten silicide film 5 may be formed on gate electrode 4 and titanium silicide film 9 may be formed on N⁺ source/drain regions 8.

Tungsten silicide film 5 and titanium silicide film 9 have different specific resistances, and they are formed through separate process steps. Therefore, it is possible to form these films to have different thicknesses. More specifically, tungsten silicide film 5 is formed by deposition through sputtering followed by patterning. Meanwhile, titanium silicide film 9 is formed by covering periphery of gate electrode 4 with an oxide film 6, applying titanium on the entire surface, and by turning it into silicide by 2 steps annealing, and thus the titanium silicide film can be formed in self-aligned manner only at an exposed region of the silicon.

Meanwhile, when the gate electrode 4 and N⁺ source/drain regions 8 should have the same resistance value, titanium silicide film 9 may be formed both on the gate electrode 4 and on N⁺ source/drain regions 8 through the same process steps. In that case, titanium silicide film 9 is formed in self-aligned manner only at the exposed region of silicon, by covering sidewall portions of gate electrode 4 with sidewall oxide film, applying titanium on the entire surface and by performing 2 steps annealing.

In the conventional bulk MOS transistors and SOI/MOS transistors, what is formed on the source region and the drain region is the titanium silicide film 9 of the same thickness. Therefore, the source region cannot have a resistance value which is different from that of drain region.

In order to reduce the resistance value of source/drain regions, thicker silicide film is preferred. However, when the silicide film is made thicker, stress at the silicide/silicon interface increases accordingly, increasing possibility of generation of crystal defects. In order to suppress generation of crystal defects, the silicide film should be made thinner. However, conventionally, the silicide film is made rather thick, in order to reduce resistance value at the source/drain regions. In this case, in order to prevent leakage current derived from the crystal defect at the source/drain junction surface, the depth of the source/drain junction surface has been made deeper so as to prevent influence of the crystal defect. In order to suppress short channel effect of the MOS transistor, it is necessary to form the source/drain junction surface at a shallower portion. However, in the conventional structure in which the silicide film is made thick to reduce the resistance values at the source/drain region, the source/drain junction surface could not be formed at a shallower portion.

Further, in the conventional SOI/MOS transistor, the substrate is in electrically floating state. Therefore, holes generated by impact ionization are accumulated in the substrate, increasing substrate potential. This results in lower potential barrier on the side of the source, which leads to lower breakdown voltage between the source/drain.

SUMMARY OF THE INVENTION

An object of the present invention is to provide a semiconductor device in which source region and drain region can have different resistance values.

Another object of the present invention is to provide a semiconductor device in which source/drain breakdown voltage can be improved.

Another object of the present invention is to provide a method of manufacturing a semiconductor device in which source region and drain region have different resistance values and in which source/drain junction surface can be formed at a shallower portion while thickness of the silicide film is made thicker.

According to one aspect of the present invention, the semiconductor device includes a first silicide film and a second silicide film. The first silicide film is formed on a semiconductor chip. The second silicide film is formed on the semiconductor chip, made of the same material as the aforementioned first silicide film, and has a thickness which is different from that of the first silicide film. Since the first and second silicide films of the same material but having different thicknesses exist in one semiconductor chip, the resistance value at a region on which the first silicide film is formed is different from that region on which the second silicide film is formed.

According to another aspect of the present invention, the semiconductor device includes source and drain regions, a first silicide film, and a second silicide film. The source and drain regions are formed at the semiconductor layer with a channel region sandwiched therebetween. The first silicide film is formed on the surface of the source region. The second suicide film is formed on the surface of the drain region, formed of the same material as the first silicide film and has a thickness different from that of the first silicide film. Preferably, the first silicide film may be formed to be thicker than the second silicide film. In that case, the semiconductor layer, on which the first and second silicide films are formed, may be formed on an insulating film.

In the semiconductor device, since the first silicide film formed on the surface of the source region and the second silicide film formed on the surface of the drain region have different thicknesses, the source region and the drain region come to have different resistance values. When the thickness of the first silicide film at the source-region is made thicker than that of the second silicide film on the drain region, undesirable influence to the transistor derived from parasitic resistance which is conspicuous in the source region can be prevented, and in addition, the problem of punchthrough can be suppressed since the thickness of the second silicide film at the drain region is the same as and not thicker than the conventional one. When the first silicide film at the source region of the semiconductor device formed on an insulating film is made thicker than that of the second silicide film formed at the drain region, the holes accumulated in the substrate can be readily ejected through the silicide film, and therefore rise of the substrate potential can be prevented.

According to a still further aspect of the present invention, the semiconductor device includes an element isolating insulating film, source/drain regions and a silicide film. The element isolating insulating film is formed at the semiconductor layer to surround an element forming region. The source/drain regions are formed in the element forming region, with a channel region sandwiched therebetween. The silicide film is formed on the surfaces of the source/drain regions, spaced by a prescribed distance from the element forming region. In the semiconductor device, a silicide film is formed at the element forming region spaced by a prescribed distance from the element isolating insulating film, and therefore leakage current generated at the edge of the element isolating insulating film can be prevented.

In the method of manufacturing a semiconductor device in accordance with a still further aspect of the present invention, a metal layer is formed on a semiconductor layer. Electrically inactivating ions are implanted from above the metal layer to the semiconductor layer, and the semiconductor layer and metal layer react with each other, whereby a metal silicide film is formed. Preferably, the step of implanting electrically inactivating ions may be implemented by rotary oblique implantation.

In the method of manufacturing a semiconductor device, electrically inactivating ions are implanted to a region where the value of parasitic resistance should specifically be lowered, so that single crystal silicon constituting the semiconductor layer is turned into amorphous. Therefore, the stress at the silicide/silicon interface generated at the silicidating reaction can be released. Therefore, generation of crystal defect can be prevented and superior silicide film can be obtained. Therefore, when electrically inactive ion are selectively implanted, a silicide film which is thicker than the conventional one can be readily formed at a prescribed region. Further, when oblique rotary implantation is employed for implanting electrically inactive ions, the single crystal silicon constituting the semiconductor layer can be uniformly turned into amorphous, providing a silicide film of superior quality.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
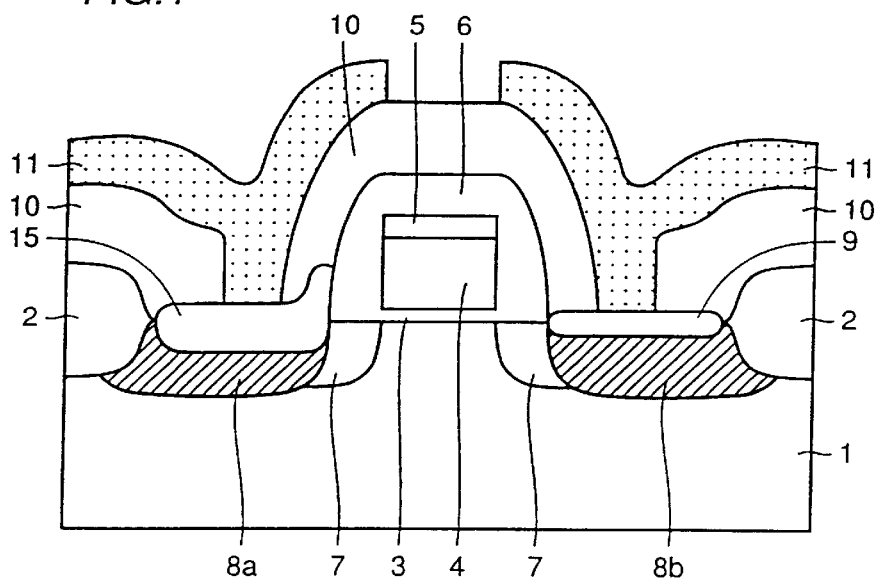
FIG. 1 is a cross section of a bulk MOS transistor in accordance with a first embodiment of the present invention.
Figure 2:
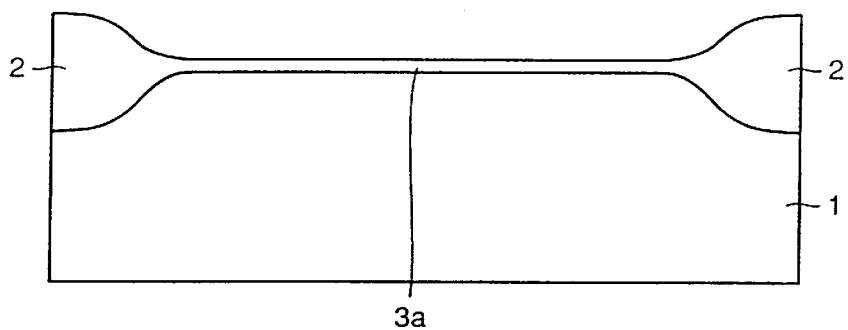
FIGS. 2 to 7 are cross sections showing the first to sixth steps of manufacturing the bulk MOS transistor in accordance with the first embodiment shown in FIG. 1.
Figure 3:
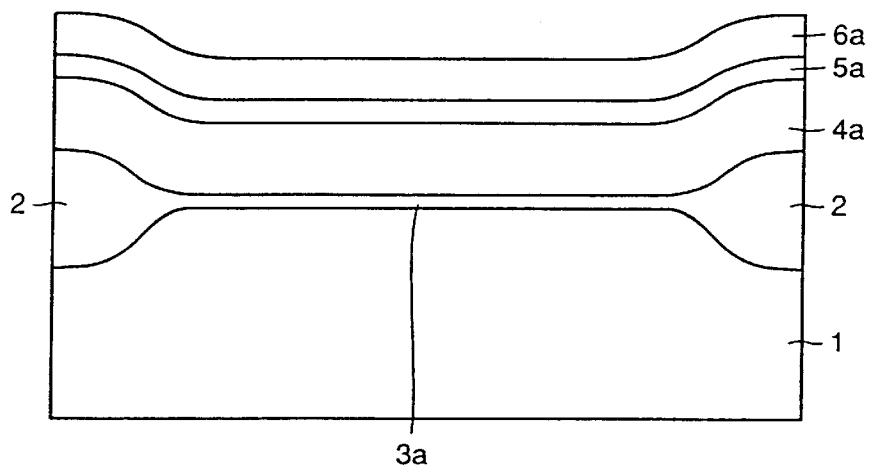

Embodiments of the present invention will be described with reference to the figures. Referring to FIG. 1, in the bulk MOS transistor in accordance with the first embodiment, an element isolating oxide film 2 is selectively formed on a main surface of a silicon substrate 1. In an active region surrounded by element isolating oxide film 2, N source/drain regions 7, 7 are formed sandwiching a channel region. A source region 8a and a drain region 8b are formed adjacent to N⁻ source/drain regions 7. On the channel region, a gate electrode 4 of polysilicon film is formed with a gate insulating film 3 interposed. A tungsten silicide film 5 is formed on gate electrode 4. An oxide film 6 is formed to cover gate electrode 4 and tungsten silicide film 5. An interlayer insulating film 10 is formed to cover the entire surface. Contact holes are formed at prescribed regions of interlayer insulating film 10. In the contact holes, aluminum interconnection 11 is formed to be electrically connected to source region 8a and drain region 8b.

Now, in the first embodiment, titanium silicide film 15 formed on the surface of source region 8a is formed to be thicker than a titanium silicide film 9 formed on the surface of drain region 8b. The difference in thickness between titanium silicide film 15 and titanium silicide film 9 is about 100 Å to 300 Å.

In the first embodiment, the titanium silicide film 15 on the source side and titanium silicide film 9 on the drain side are formed to have different thicknesses, whereby source region 8a and drain 8 can have different resistance values. Therefore, the resistance value of the source region 8a at which parasitic resistance considerably affects the transistor characteristic can be reduced by providing a thick silicide film 15. Meanwhile, on the drain side where the problem of the resistance value is not so serious as on the source region 8a, a thin silicide film 9 can be provided so as to prevent excessive decrease in resistance value of drain region 8b, whereby the punchthrough phenomenon can be prevented.

Referring to FIGS. 2 to 7, the process for manufacturing the bulk MOS transistor in accordance with the first embodiment will be described. First, referring to FIG. 2, silicon substrate 1 is oxidized by LOCOS (LOCal Oxidization of Silicon) in a wet atmosphere at about 950° C., whereby an element isolating oxide film 2 having the thickness of about 3000 Å is formed. On a region which was not subjected to LOCOS oxidation, an oxide film 3a which will be the gate insulating film 3, is formed.

Figure 4:
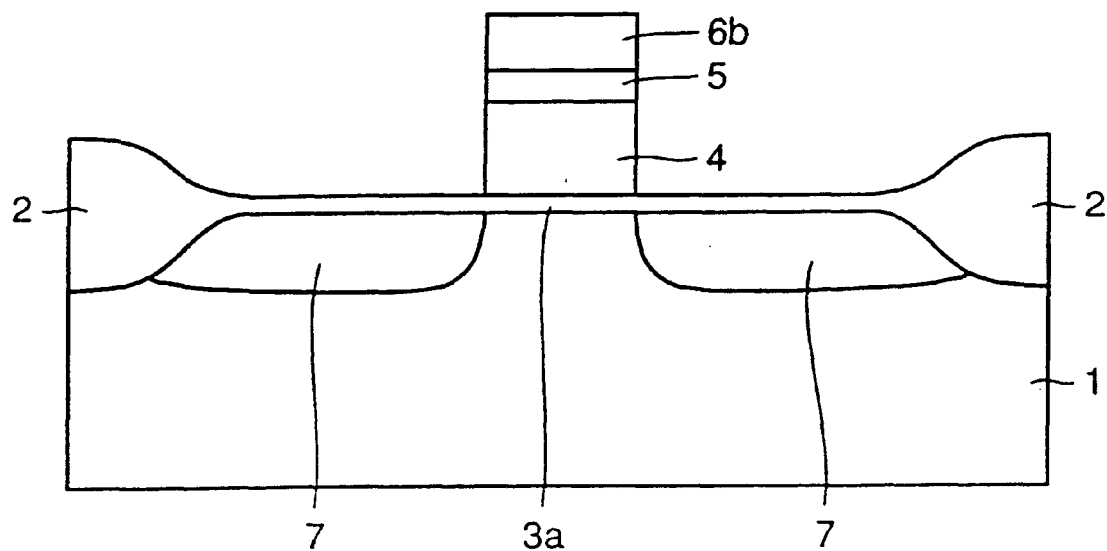
Figure 5:
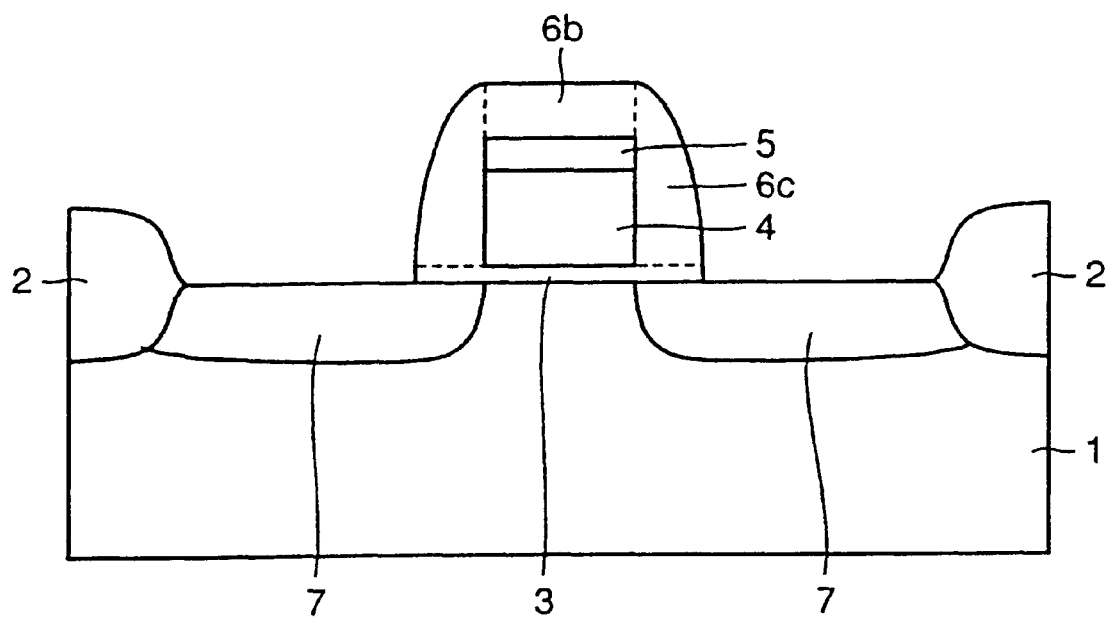

Thereafter, a polycrystalline silicon film 4a, tungsten silicide film 5a and an oxide film 6a are formed on the entire surface in this order, by CVD, sputtering and CVD, respectively. Then, by patterning oxide film 6a, tungsten silicide film 5a and polysilicon film 4a to the shape of the gate electrode, a gate electrode 4, a tungsten silicide film 5 and an oxide film 6b such as shown in FIG. 4 are formed. Thereafter, by using oxide film 6b and tungsten silicide film 5 as a mask, impurity ions are implanted to silicon substrate 1, whereby N⁻ source/drain regions 7 are formed. Thereafter, an oxide film (not shown) is deposited on the entire surface, it is etched back to form a gate insulating film 3, and sidewall oxide films 6c are formed at side surface portions of gate electrode 4, tungsten silicide film 5 and oxide film 6b. Sidewall oxide film 6c and oxide film 6b provide the oxide film shown in FIG. 6.

Thereafter, a titanium layer 16 is formed on the entire surface to the thickness of at most 500 Å by sputtering, and then a photoresist 20 is formed to cover the drain region.

Figure 7:
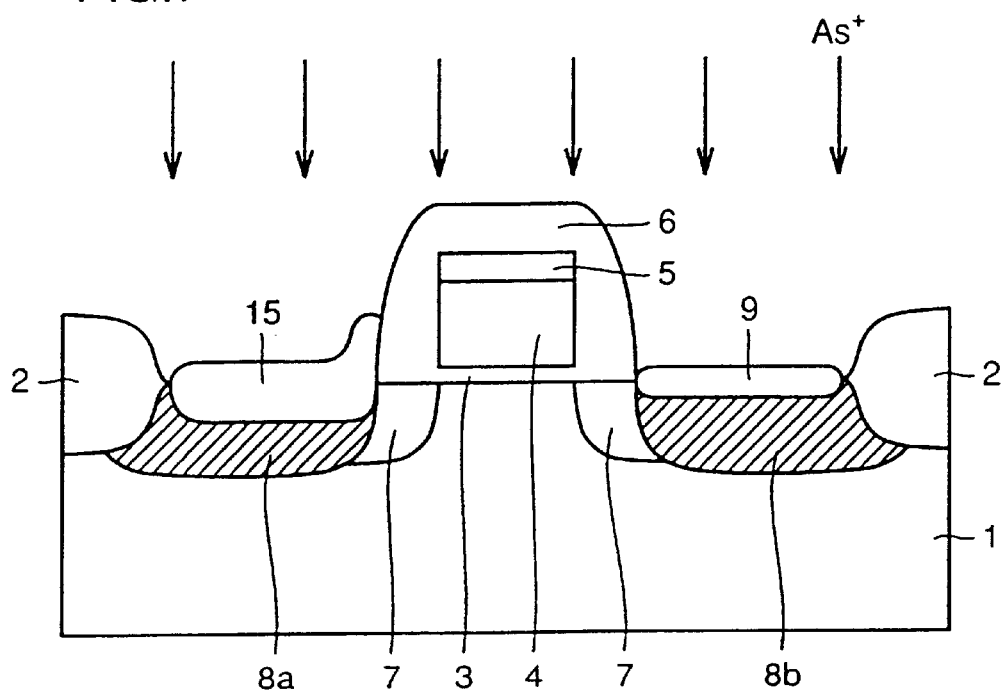

Using the photoresist 20 as a mask, electrically inactivating ions (hereinafter referred to as inactive ions) such as silicon ions, oxygen ions or nitrogen ions are implanted only to the source region, by rotary oblique ion implantation with the energy of 30 keV to 100 keV, concentration of $4-5\times10^{14}/cm^2$ to $1\times10^{16}/cm^2$, at an angle of 30° to 45°. Consequently, the crystal at the surface of the silicon layer is damaged, causing mixing at the interface of titanium/silicon. This allows smooth reaction of subsequent silicidation. Thereafter, photoresist 20 is removed. Then, by 2 steps annealing as described in the following, titanium silicide films 15 and 9 such as shown in FIG. 7 are formed in self-aligned manner only on the surface of source/drain regions. More specifically, by (first step) heat treatment in a nitrogen atmosphere at about 680° for 30 seconds, titanium which is in contact with silicon reacts. Thus $Ti_x$, $Si_{1-x}$ having the structure of C49, which is a metastabilized compound, is formed. Titanium on the insulating film (element isolating oxide film 2 and oxide film 6) is removed in self-aligned manner by a mixed solution of hydrogen peroxide and sulfuriic acid. Then, again by (second step) heat treatment in a nitrogen atmosphere at about 850° C. for 30 seconds, silicide films 15 and 9 are turned to C54 structure which is a stable structure. At this time, since the source region has been mixed with inactivating ions, silicidation reaction occurs more easily than in the drain region and the speed of reaction is faster. Therefore, compared with the silicide film 9 formed on the drain region, the silicide film 15 is formed thicker.

Further, the reaction at the source side is between titanium and amorphous silicon, and therefore stress generated at the reaction is smaller as compared with the reaction at the drain side, which is between titanium and single crystal silicon layer. Therefore, the density of crystal defects generated at the silicide/silicon interface is also smaller, enabling uniform reaction.

Thereafter, by using element isolating oxide film 2 and oxide film 6 as a mask, impurity is implanted to silicon substrate 1 through titanium silicide films 9 and 15, and thus $N^+$ source region 8a and $N^+$ drain region 8b are formed. At this time, the implantation energy should be set such that the crystal defects in the drain region are not included in a depletion layer positioned at the finally provided PN junction surface. Ideal PN junction characteristic can be obtained when the implantation energy is selected such that the range of projection ($R_P$) is positioned near the interface between the silicide film 9 and silicon substrate 1. On the source side, generation of defects is suppressed because of mixing, while defects are not generated on the drain side since the silicide film is inherently thick. For example, when the thickness of the silicide film 15 on the source side and the impurity is arsenic ions for forming an N channel transistor, the preferable energy is about 50 keV, and when the impurity is boron ions for forming a P channel transistor, the preferable energy is about 40 keV. After ion implantation, furnace-annealing is performed at 850° C. for about 30 minutes, so as to activate implanted impurity.

Finally, as shown in FIG. 1, an interlayer insulating film 10 of an oxide film is formed, and contact holes for electrical connection to the source/drain regions and to the gate electrode are provided in the interlayer insulating film 10. Thereafter, an aluminum layer is formed by sputtering, the aluminum layer is patterned and hydrogenated to form interconnection. Thus aluminum interconnection 11 is provided. Through these steps, the MOS transistor in accordance with the first embodiment is completed.

In the manufacturing process described above, inactivating ions are implanted after the deposition of titanium layer.

However, titanium layer 16 may be deposited after implantation of inactive ions. In that case, uniformity of reaction at the titanium/silicon interface is inferior to the above described process. However, if surface washing by fluorine or hydrogen peroxide wet processing is performed after ion implantation, metal contamination derived from ion implanter can be prevented.

In the process of manufacturing the MOS transistor in accordance with the first embodiment described above, a thick silicide film 15 is formed on $N^+$ source region 8a. However, because of the mixing effect described above, generation of crystal defects in the silicon substrate 1 below $N^+$ source region 8a can be suppressed. Therefore, superior PN junction characteristic is obtained in $N^+$ source region 8a, and as a result, generation of junction leakage current can be suppressed. Further, even when silicidation is performed by depositing titanium layer 16 having the same thickness as in the conventional device, the silicide film 15 can have larger thickness than the conventional example, because of mixing effect. Therefore, it is not necessary to increase junction depth of source/drain regions in order to obtain a thick silicide film, unlike the prior art. Therefore, in the first embodiment, the source/drain junction surface can be formed at a shallower portion.

Figure 8:
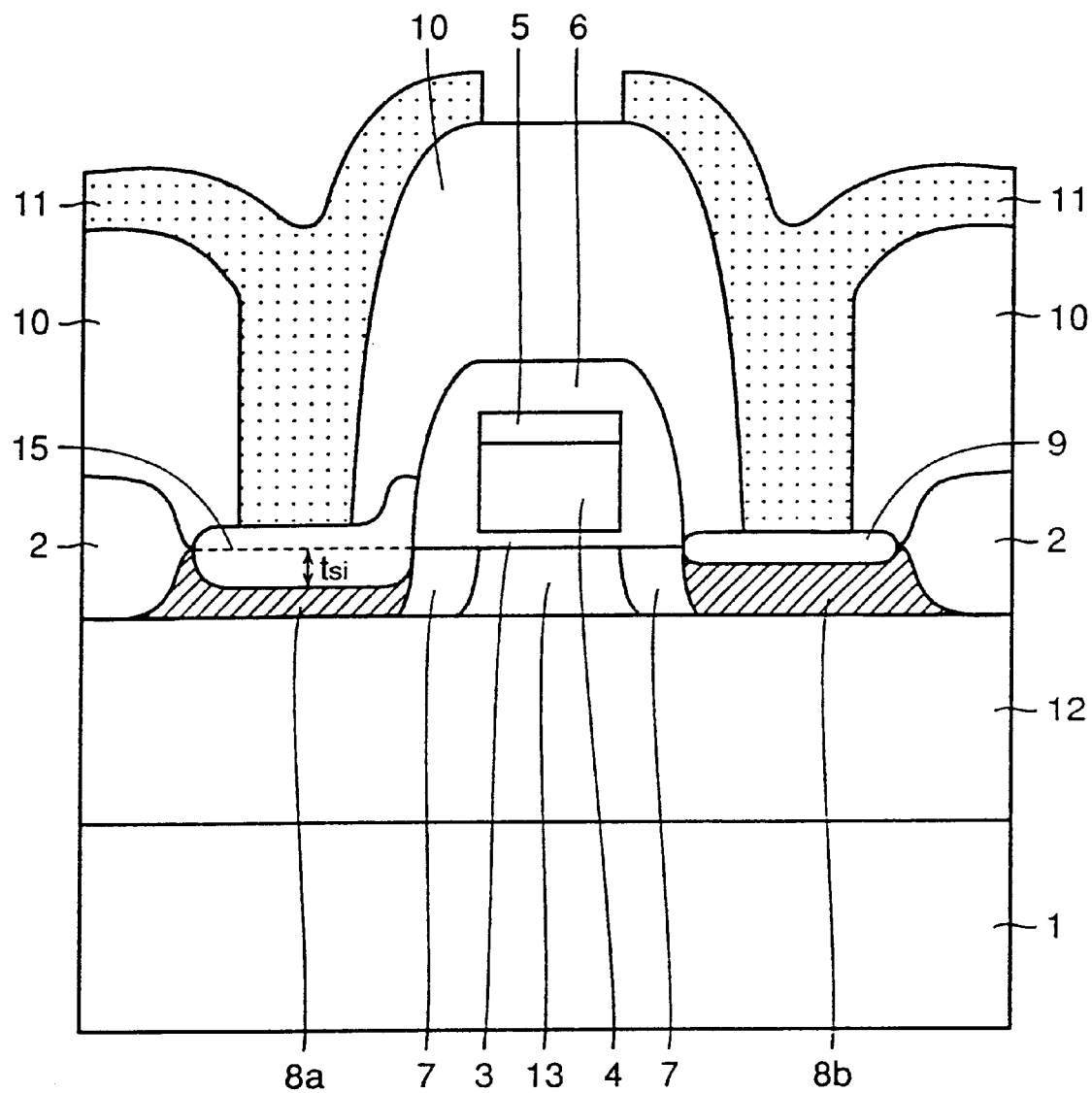
FIG. 8 is a cross section of an SOI/MOS transistor in accordance with a second embodiment of the present invention.

Referring to FIG. 8, the SOI/MOS transistor in accordance with a second embodiment of the present invention will be described. In the second embodiment, the same MOS transistor as the first embodiment is formed on an SOI substrate including a silicon substrate 1, a buried oxide film 12 thereon, and an SOI layer 13. More specifically, on $N^+$ source region 8a formed in SOI layer 13, titanium silicide film 15 which is thicker than titanium silicide film 9 provided on $N^+$ drain region 8b, is formed. The thickness of the silicon layer consumed by silicidation is represented by $t_{Si}$.

The process for manufacturing the SOI/MOS transistor in accordance with the second embodiment shown in FIG. 8 will be described. In the second embodiment, an MOS transistor is formed through approximately the same manufacturing process as the process described with reference to the first embodiment, on the SOI layer 13 having the thickness of at most about 1000 Å. Since conditions for implanting inactive ions, thicknesses of titanium to be deposited, conditions for ion implantation to $N^+$ drain region 8b are different from the process described above, these will be described in greater detail.

Figure 6:
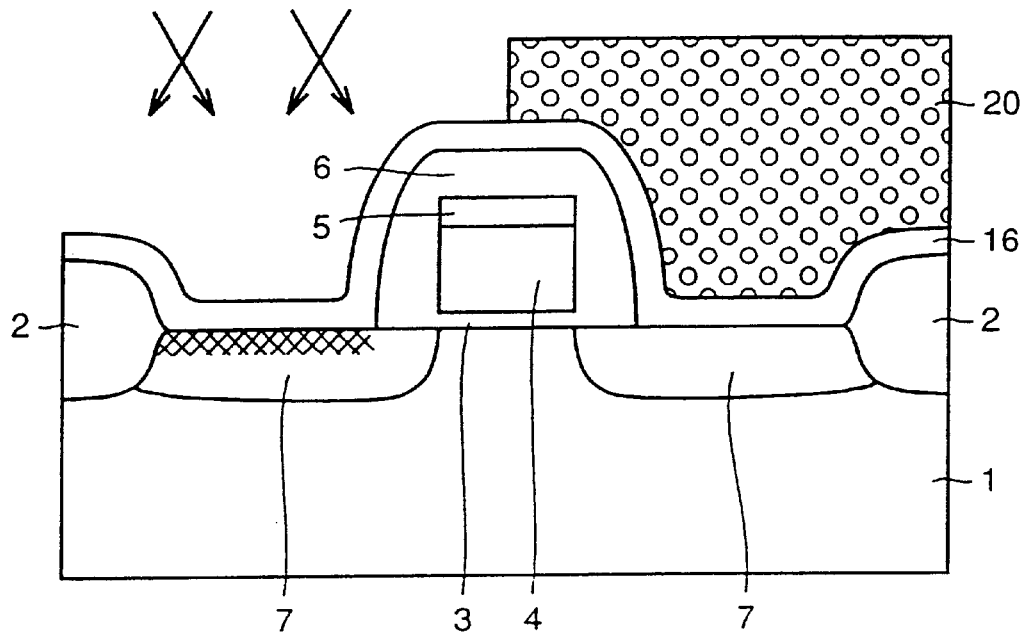
Figure 9:
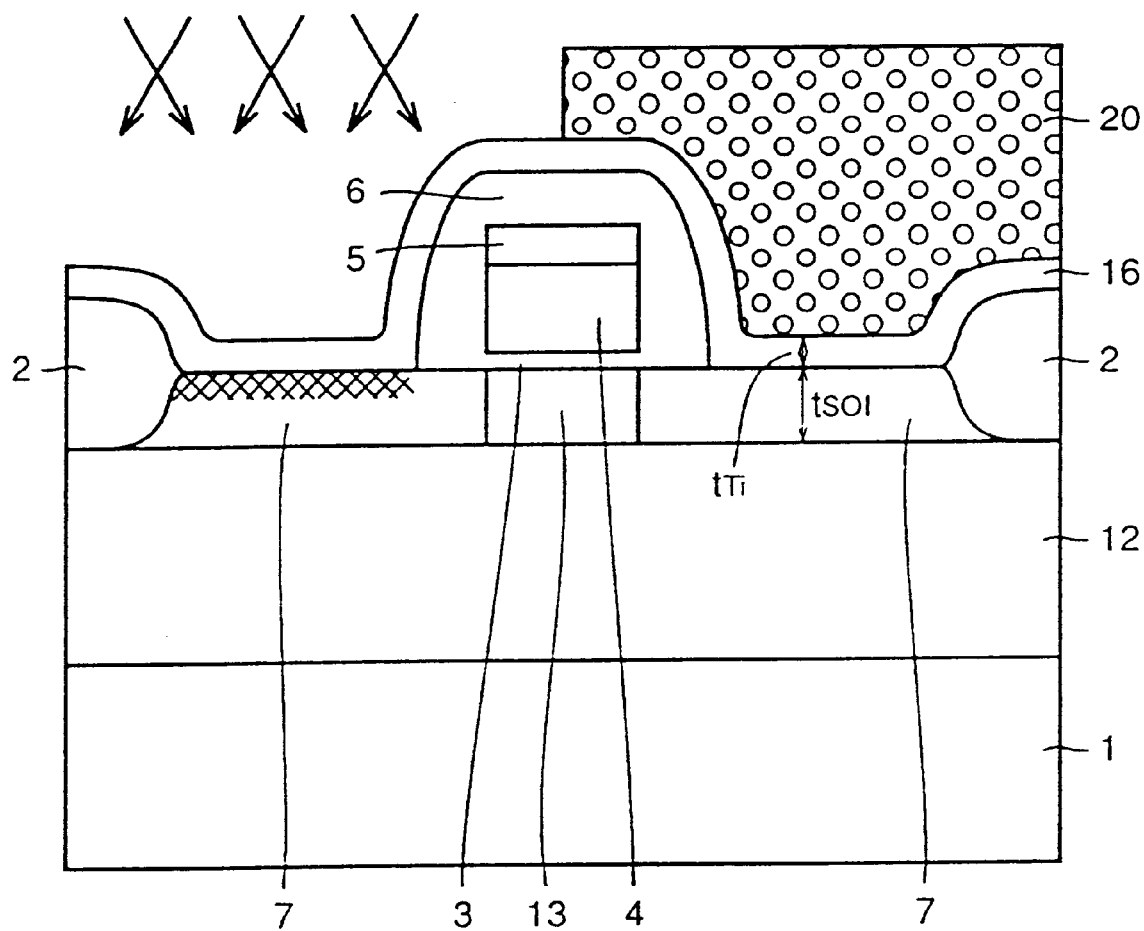
FIG. 9 is a cross section illustrating a process for manufacturing the SOI/MOS transistor in accordance with the second embodiment shown in FIG. 8.
Figure 10:
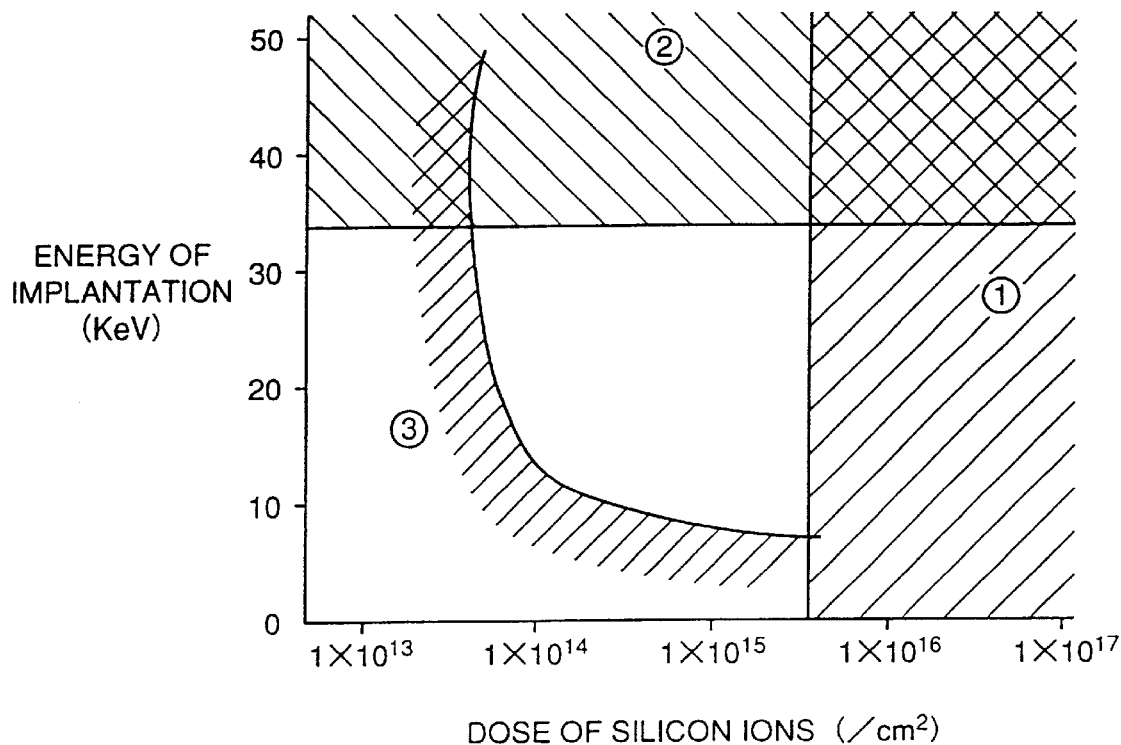
FIG. 10 shows relation between dose of silicon ions and implantation energy, when silicon ions are directly implanted into SOI layer having the thickness of 1000 Å.
Figure 11:
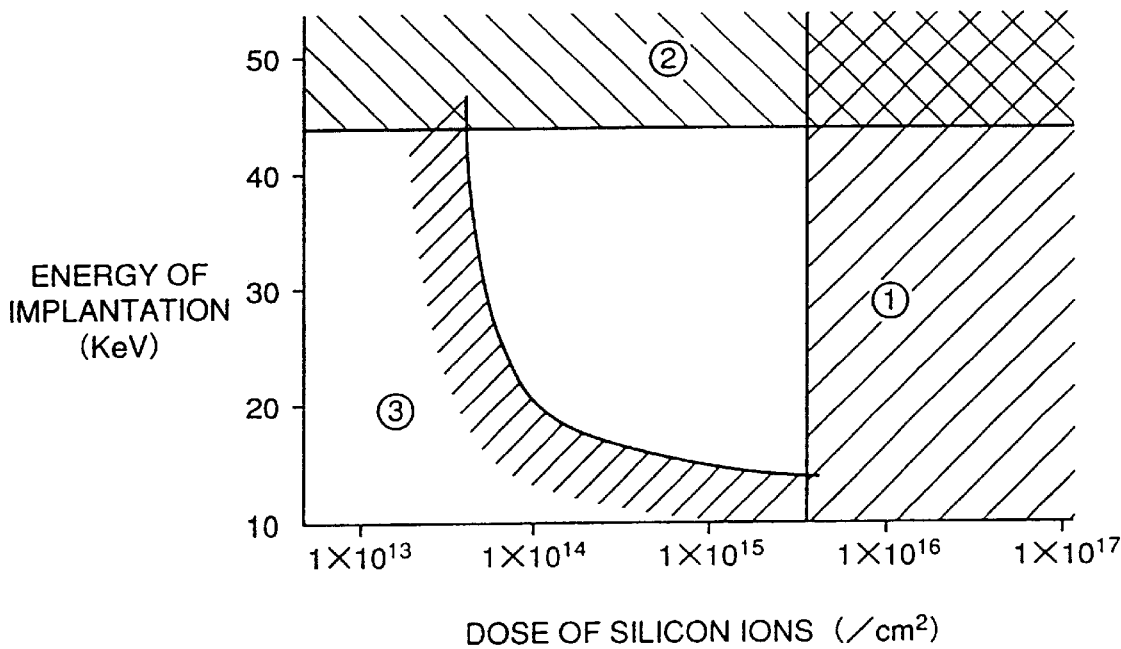
FIG. 11 shows relation between dose of silicon ions and implantation energy when a titanium layer is deposited by sputtering to the thickness of 200 Å on an SOI layer having the thickness of 1000 Å and then silicon ions are implanted.

FIG. 9 shows a process corresponding to the manufacturing process of the first embodiment shown in FIG. 6, and FIG. 9 shows the step of implanting inactivating ions after the formation of titanium layer 16. Referring to FIG. 9, thickness of SOI layer 13 is represented by $T_{SOI}$, while thickness of titanium layer 16 is represented by $t_{Ti}$. FIG. 10 shows relation between implantation energy and dose of silicon ions, when silicon ions are directly implanted to SOI layer 13 having the thickness of about 1000 Å. FIG. 11 shows relation between implantation energy and dose of silicon ions when titanium layer 16 having the thickness of 200 Å is deposited by sputtering on the SOI layer 13 having the thickness of 1000 Å and thereafter silicon ions are implanted.

Referring to FIGS. 10 and 11, when implantation is performed under the condition such as representation by area 1, that is, with the dose of silicon ions exceeding $5\times10^{15}/cm^2$, crystal defects near the implanted region increases, and as a result, leakage current between source/drain region increases. When implantation is performed under the condition represented by area 2 namely with the energy higher than implantation energy of 35 keV, in the example of shown in FIG. 10, or implantation energy exceeding 44 keV in the example of FIG. 11, crystal property at the interface of SOI layer 13/buried oxide layer 10 is degraded.

When implantation is effected under the condition represented by area 3, the thickness of the layer to be turned into amorphous by silicon ions is not sufficiently thick. Therefore, the reaction which takes place after the reaction of silicidation to some extent is only the conventional reaction between single crystal silicon and titanium. Therefore, silicidation is not sufficient. Especially in the example shown in FIG. 11, silicon ions are accumulated in titanium and not reach SOI layer 13, so that SOI layer 13 is not turned into amorphous. Therefore, even when the amount of silicon ions is the same, sufficient reaction of silicidation cannot be ensured in the example of FIG. 11 unless implantation is performed with higher implantation energy than the example of FIG. 10. Therefore, ion implantation must be performed under such implantation condition that does not fall within any of the areas 1 to 3. In case of a bulk MOS transistor such as shown in the first embodiment, there is not a buried oxide film 12, and therefore it is not necessary to take into consideration the condition represented by the area 2. However, in that case, the implantation condition must be selected such that the depth in the direction of substrate of the region including crystal defects should be shallower than the source/drain junction depth.

Figure 12:
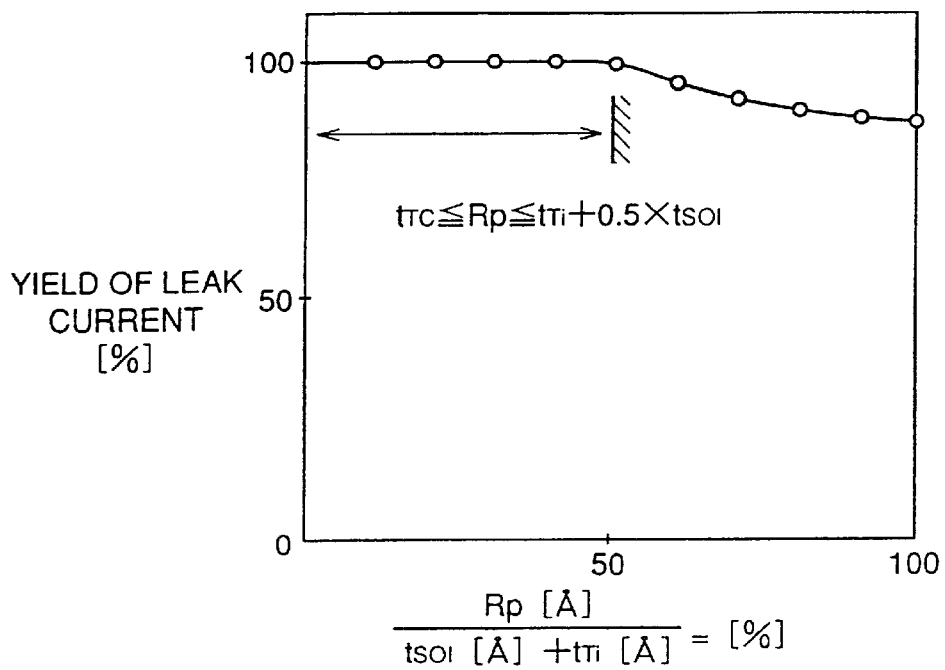
FIG. 12 shows relation between the range of projection of silicon ions and yield of the finished transistors.

FIG. 12 represents relation between the range of projection $R_P$ of silicon ions and yield of the finished MOS transistors. Referring to FIG. 12, the abscissa represents the ratio of the range of projection $R_P$ of silicon ions, normalized by the sum of thickness $t_{SOI}$ of SOI layer and thickness $t_{Ti}$ of titanium, while the ordinate represents yield of leakage current of TEG (Test Elementary Group) when 1000 transistors are connected in parallel. Referring to FIG. 12, the range of projection $R_P$ of silicon ions should be set within the range of $$t_{Ti} < R_P < t_{Ti} + 0.5 \times t_{SOI}$$

in order to attain the yield of 100%. More specifically, when implantation energy is increased and the range $R_P$ becomes larger, the crystal defects induced by implantation proceeds to the direction of the channel of the MOS transistor, possibly causing leak current. Therefore, the range $R_P$ of projection must be set within the above described range.

Figure 13:
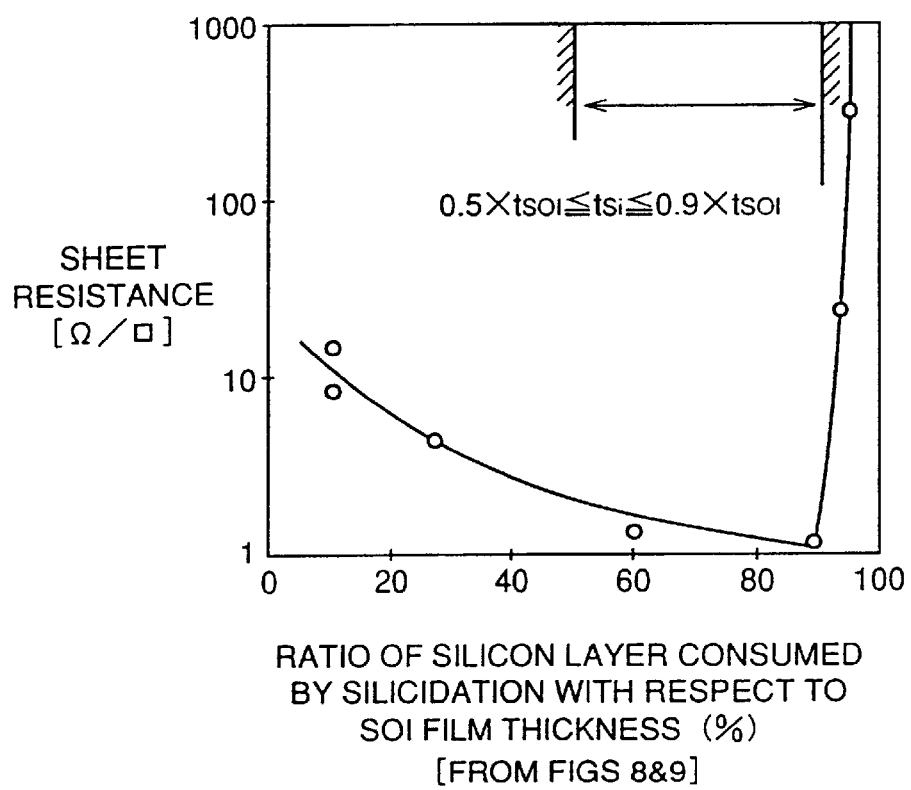
FIG. 13 shows relation between the amount of consumption of silicon and sheet resistance in the step of silicidation.

The relation between the amount of silicon layer consumed by silicidation and sheet resistance of the silicide film will be described. Different from the bulk MOS transistor, SOI/MOS transistor has a thin SOI layer 13. Therefore, the reaction of silicidation proceeds in the depth direction of the SOI layer 13. Therefore, it is considered that the silicide film formed by the silicide reaction reaches the buried oxide film 12 below SOI layer 13. FIG. 13 shows the relation between the amount of silicon layer consumed by silicidation and the resistance value of the silicide film. Referring to FIG. 13, the abscissa shows the ratio of the thickness $t_{Si}$ (see FIG. 8) of the silicon layer consumed by silicidation with respect to the thickness $t_{SOI}$ of the SOI layer, and the ordinate represents sheet resistance value of the silicide film. As shown in FIG. 13, when most SOI layer is consumed by silicidation, the formed silicide film agglomerates because of subsequent heat treatment, and as a result, the sheet resistance increases in the order of magnitude.

Therefore, in the SOI/MOS transistor, the silicon layer must be left between silicide film 15 and buried oxide film 12 even after the end of silicidation. For example, when the sheet resistance value of silicon film 15 which is formed by the reaction with SOI layer 13 having the thickness of 1000 Å should be set to 5 Ω/□ at the highest, the thickness $t_{Si}$ of the silicon layer which is consumed must satisfy the following relation:

$$0.5 \times t_{SOI} \leq t_{Si} \leq 0.9 \times t_{SOI} (500 \text{ Å} \leq t_{Si} \leq 900 \text{ Å}).$$

When we consider the reaction of silicidation of a thinner SOI layer having the thickness of 500 Å, for example, the upper limit of the thickness $t_{Si}$ of the silicon layer which is consumed is $0.9 \times t_{SOI} = 450$ Å from the reasons described above. As for the lower limit, the design condition may be selected in accordance with the resistance value. If a relatively high sheet resistance value is acceptable, the lower limit of the thickness $t_{Si}$ of the silicon layer to be consumed may be set at $0.5 \times t_{Si} = 250$ Å. If lower resistance value is necessary, the lower limit may be set to $0.75 \times t_{Si} = 375$ Å. In any case, the thickness $t_{Si}$ of the silicon layer consumed in the reaction of silicidation must be within the range of $0.5 \times t_{SOI} < t_{Si} < 0.9 \times t_{SOI}$.

The conditions for ion implantation to form N$^+$ source/drain regions 8 will be described. The implantation for N$^+$ source/drain is performed after silicidation by 2 steps annealing and formation of titanium silicide film 15 on the source side and titanium silicide film 9 on the drain side, as in the prior art. The energy of ion implantation at this time should be selected such that the peak impurity concentration is positioned at the interface between SOI layer 13 and buried oxide film 12. When the thickness $t_{SOI}$ of SOI layer 13 is 1000 Å, for example, and the impurity is arsenic ions for forming NMOS transistor, the preferable implantation energy is about 100 keV to 150 keV, and when the impurity is boron ions for forming P channel MOS transistor (hereinafter referred to as PMOS transistor), preferable implantation energy is about 20 keV to about 40 keV. In an SOI/MOS transistor, it is not necessary to select such implantation condition that takes into account the defects generated at the silicide/silicon interface, provided that under the selected implantation condition, the source/drain junction surface reaches the buried oxide film 12 and the silicide/silicon interface exhibit ohmic characteristic.

The effect of the second embodiment will be described. In the SOI/MOS transistor also, it is possible to set the thicknesses of titanium silicide film 15 on the source side and of the titanium silicide film 9 on the drain side differently. Therefore, N$^+$ source region 8a and N$^+$ drain region 8b can have different resistance values, and thus the same effect as in the first embodiment can be obtained. In the SOI/MOS transistor of the second embodiment, titanium silicide film 15 is thick, and therefore the side surface portion of titanium silicide film 15 is near the channel region. Therefore, the holes generated by impact ionization near the edge of the drain region are not accumulated near the source nor in the channel region but ejected to the silicide film 15 on the source side. Therefore, the emitter injection efficiency derived from the operation of the parasitic bipolar transistor can be decreased, and as a result, source/drain breakdown voltage can be improved. In the SOI/MOS transistor, the PN junction interface in the source/drain region is only a vertical surface with respect to the main interface of SOI layer 13, and there is not a PN junction interface which is horizontal to the substrate as in the bulk silicon. However, when an MOS transistor is to be formed on SOI layer 13, the junction characteristic at the source/drain region is superior to the bulk MOS transistor shown in the first embodiment. More specifically, when MOS transistor is formed on a thin SOI layer 13, the junction area of source/drain regions become smaller, and therefore there is not much influence on the device characteristic even when leakage current is generated to some extent.

Figure 14:
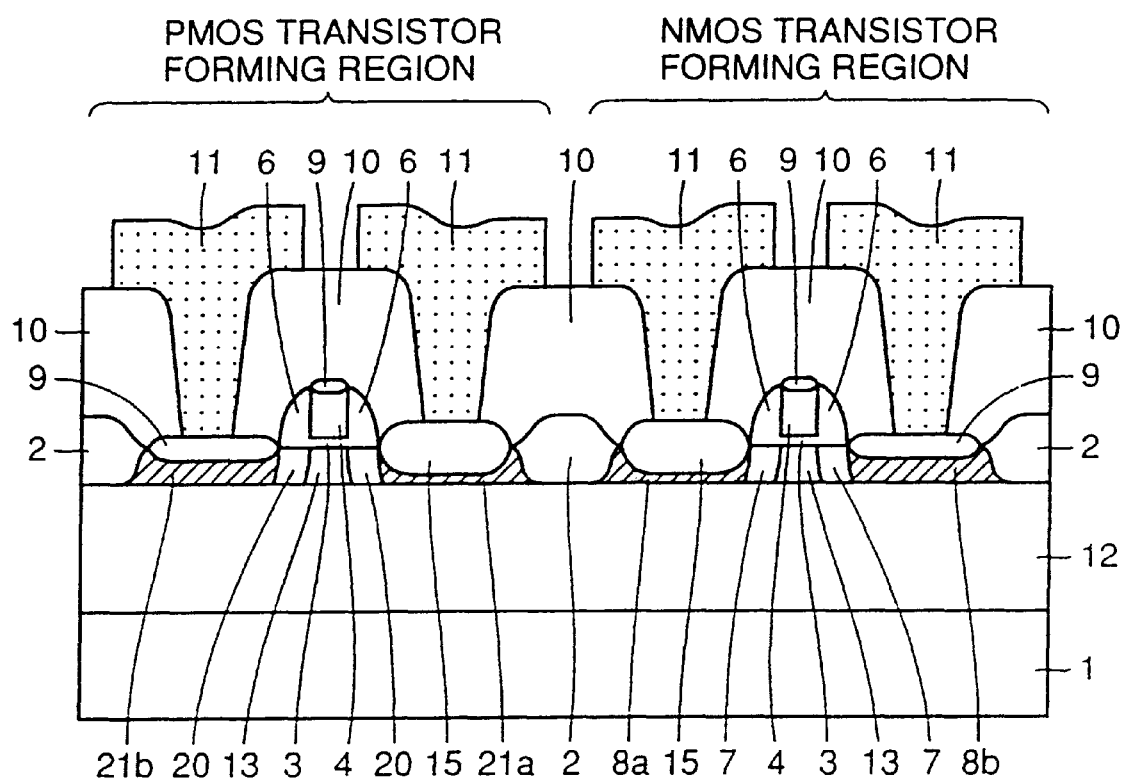
FIG. 14 is a cross section showing an SOI/CMOS transistor in accordance with a third embodiment of the present invention.
Figure 15:
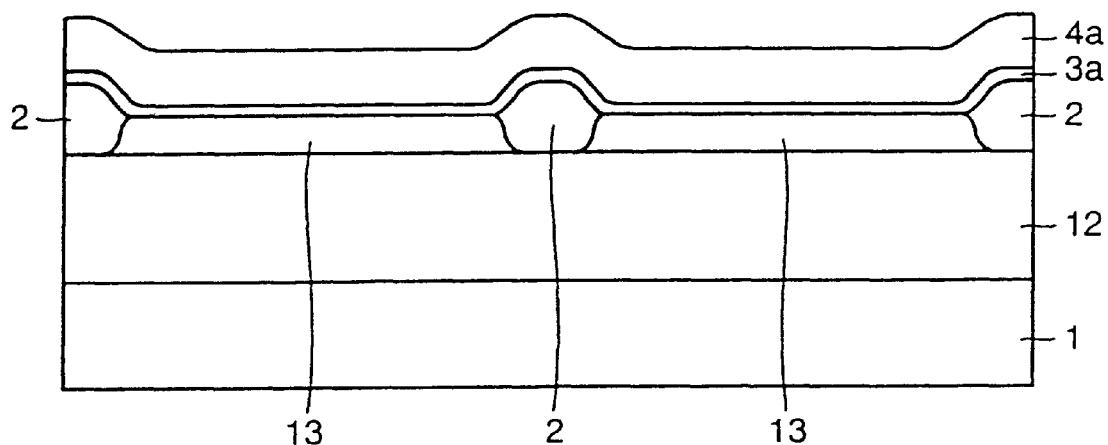
FIGS. 15 to 19 are cross sections showing the first to fifth steps of manufacturing the SOI/CMOS transistor in accordance with the third embodiment shown in FIG. 14.

Referring to FIG. 14, a structure of an SOI/CMOS transistor in accordance with the third embodiment of the present invention will be described. The third embodiment is an example of application of the present invention to a CMOS transistor having SOI structure. On SOI layer, a PMOS transistor and NMOS transistor are formed, sandwiching an element isolation oxide film 2. In PMOS transistor region, P⁻ source/drain regions 20 are formed sandwiching a channel region. P⁺ source region 21a and P⁺ drain region 21b are formed adjacent to P⁻ source/drain regions 20. P⁻ source/drain regions 20, P⁺ source region 21a and P⁺ drain region 21b provide an LDD structure of the PMOS transistor.

In the third embodiment, in the CMOS transistor having NMOS transistor and PMOS transistor formed on one substrate, titanium silicide film 15 on the source side of both of NMOS and PMOS transistors are formed to have a thickness different from that of titanium silicide film 9 on the drain side. Titanium silicide film 9 is formed in self-aligned manner on the gate electrode 4 of both the NMOS and PMOS transistors.

Figure 16:
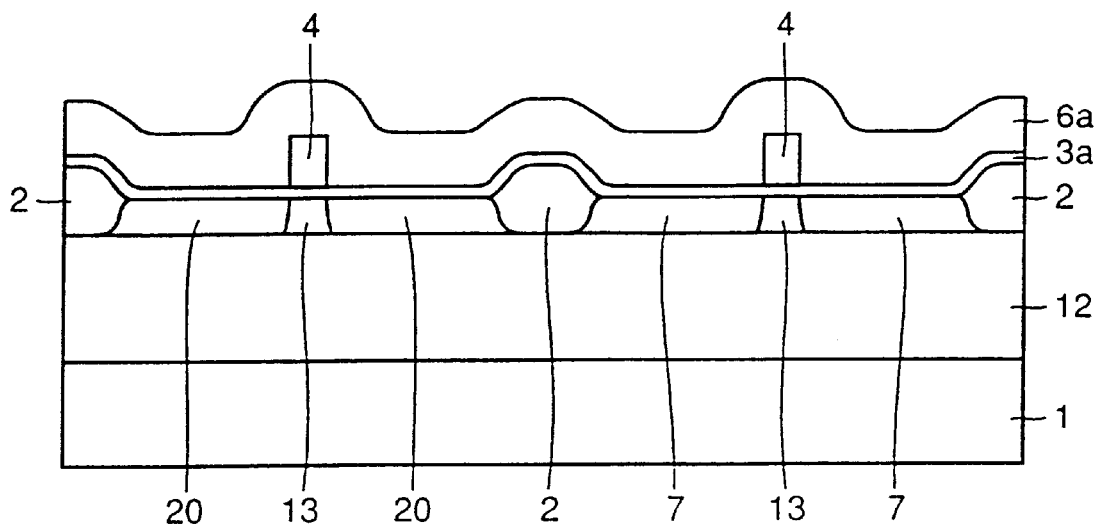
Figure 17:
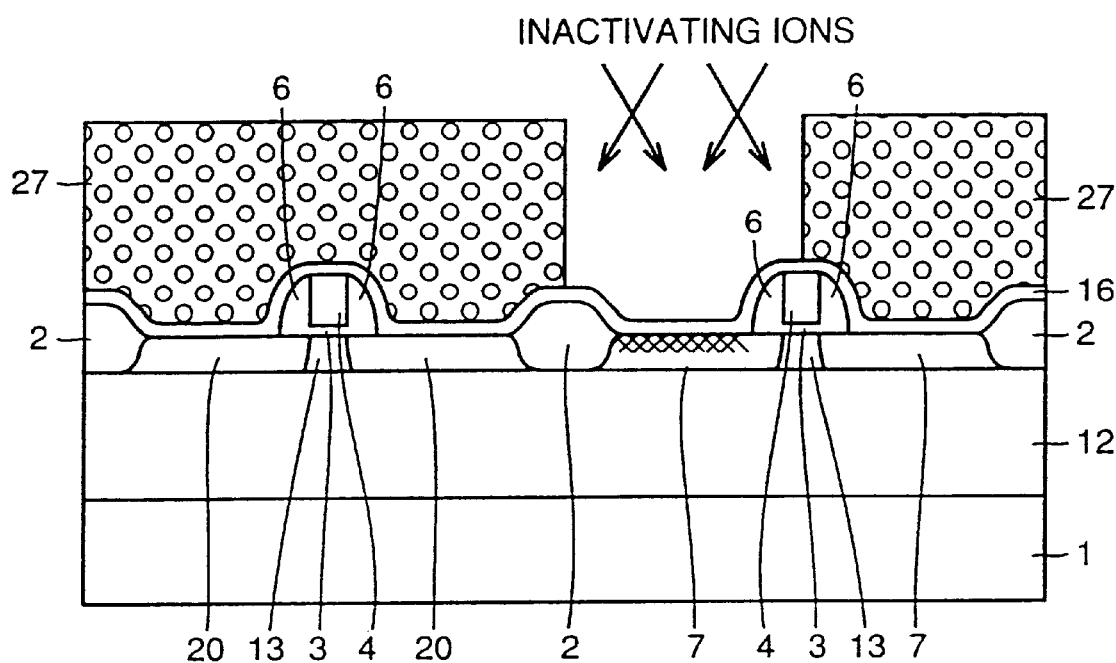

The process for manufacturing the SOI/CMOS transistor of the third embodiment shown in FIG. 14 will be described. First, SOI layer 13 having the thickness of 1000 Å is oxidized by LOCOS in a wet atmosphere at the temperature of about 950° C., so that an element isolating oxide film 2 is formed to have the thickness of about 2600 Å. Thereafter, an oxide film 3a is formed to the thickness of about 1000 Å, and on oxide film 3a, a polycrystalline silicon film 4a doped with phosphorus with the impurity concentration of $1\times10^{20}/cm^3$ is formed to the thickness of about 1000 Å. Thereafter, polysilicon film 4a is patterned to form such a gate electrode 4 as shown in FIG. 16. Thereafter, N⁻ source/drain regions 7 are formed in the NMOS transistor forming region, and P source/drain regions 20 are formed in the PMOS transistor forming region. Thereafter, an oxide film 6a is deposited on the entire surface, and an oxide film 6 such as shown in FIG. 17 is formed only at the side surface portions of gate electrode 4 under strongly anisotropical etching condition. At this time, oxide film 3a is also etched to the shape of gate insulating film 3.

Thereafter, titanium layer 16 is formed on the entire surface by sputtering, a photoresist 27 is formed on regions other than the source region of NMOS transistor, and by using photoresist 27 as a mask, inactivating ions such as silicon are implanted by rotary oblique implantation with the energy of 35 keV, concentration of $2\times10^{15}/cm^2$ and at an angle 30° to 45° Thereafter, photoresist 27 is removed.

Figure 18:
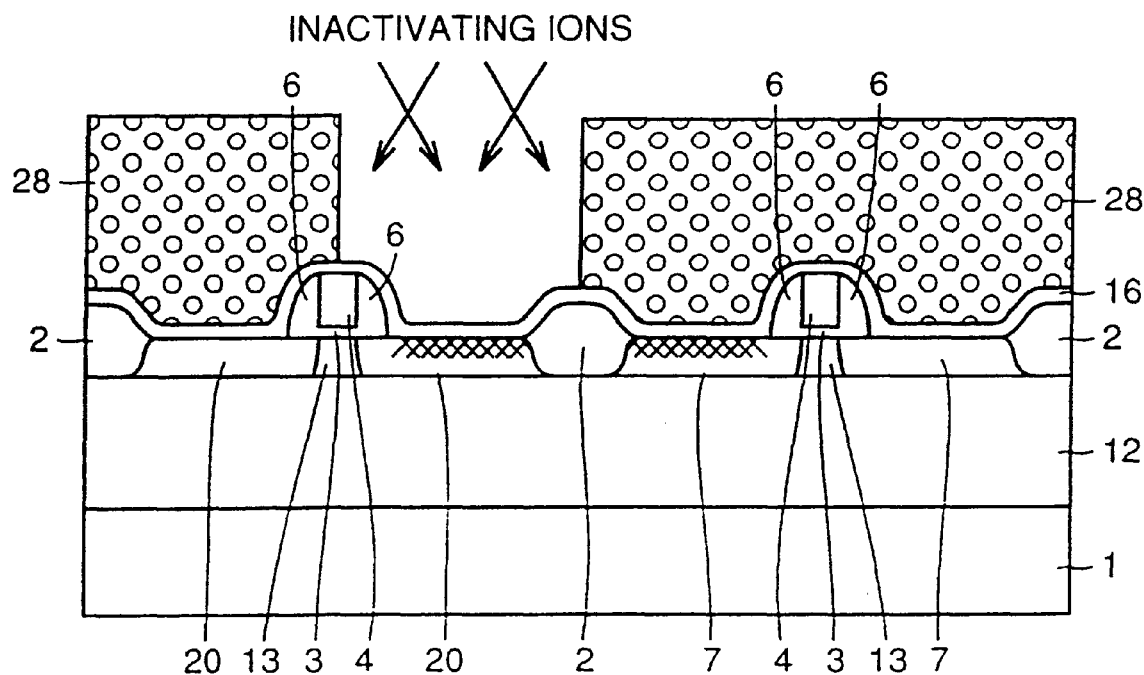
Figure 19:
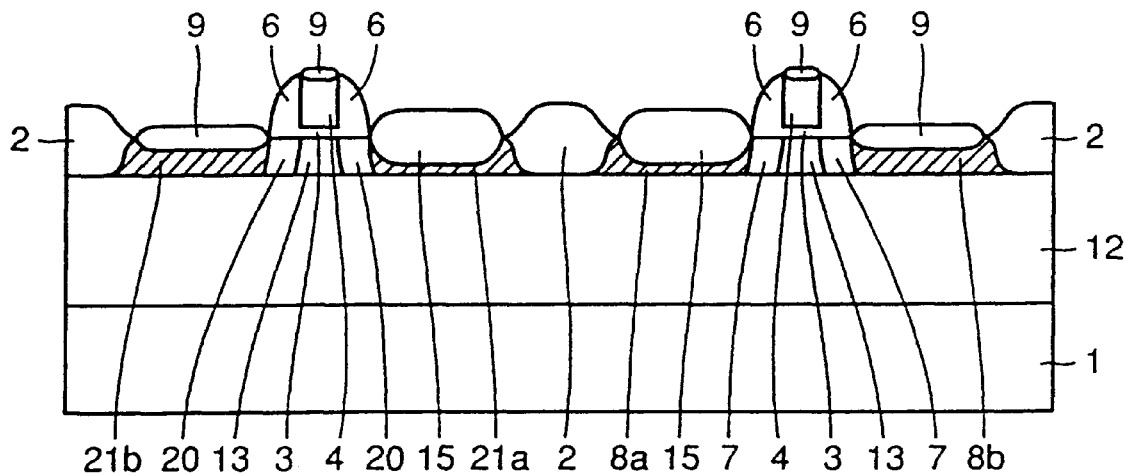

Thereafter, as shown in FIG. 18, a photoresist 28 is formed to cover regions other than the source region of PMOS transistor, and using the photoresist 28 as a mask, inactivating ions such as nitrogen is implanted by rotary oblique implantation with the energy of 35 keV and $2\times10^{15}/cm^2$. In this example, silicon ions are implanted to the NMOS transistor and nitrogen ions are implanted to the PMOS transistor. However, when ions of the same impurity are to be implanted, ion implantation may be performed by providing the photoresist at regions other than the source regions of NMOS and PMOS transistors. In such a case, only one step of forming the photoresist is necessary, and therefore the manufacturing process can be simplified. Thereafter, photoresist 28 is removed.

Then, by using 2 steps annealing, titanium silicide films 9 and 15 are formed in self-aligned manner only on the source/drain regions and the gate electrode 4. At this time, the reaction of silicidation proceeds sufficiently in the source regions of NMOS transistor and PMOS transistor, to which region inactivating ions have been implanted as already described with reference to the first embodiment. Therefore, titanium silicide film 15 becomes thicker than titanium silicide film 9 formed at the drain regions. The thickness of the titanium silicide film 15 on the source side is 500 to 800 Å, while the thickness of the titanium silicide film 9 on the drain side is 100 to 600 Å.

The conditions for silicidation have been already described with reference to the second embodiment, and therefore the description is not repeated.

In the SOI/CMOS transistor of the third embodiment also, the thicknesses of the titanium silicide film 15 on the source side and titanium silicide film 9 on the drain side can be made different from each other, therefore the source region and the drain region can have different resistance values, and hence the same effect as in the second embodiment can be obtained. By effecting inactive ion implantation to the NMOS transistor and inactive ion implantation to the PMOS transistor through different steps, it is also possible to set the thickness of silicide film 15 on the source side of the NMOS transistor different from that of titanium silicide film 15 on the source side of the PMOS transistor.

Figure 20:
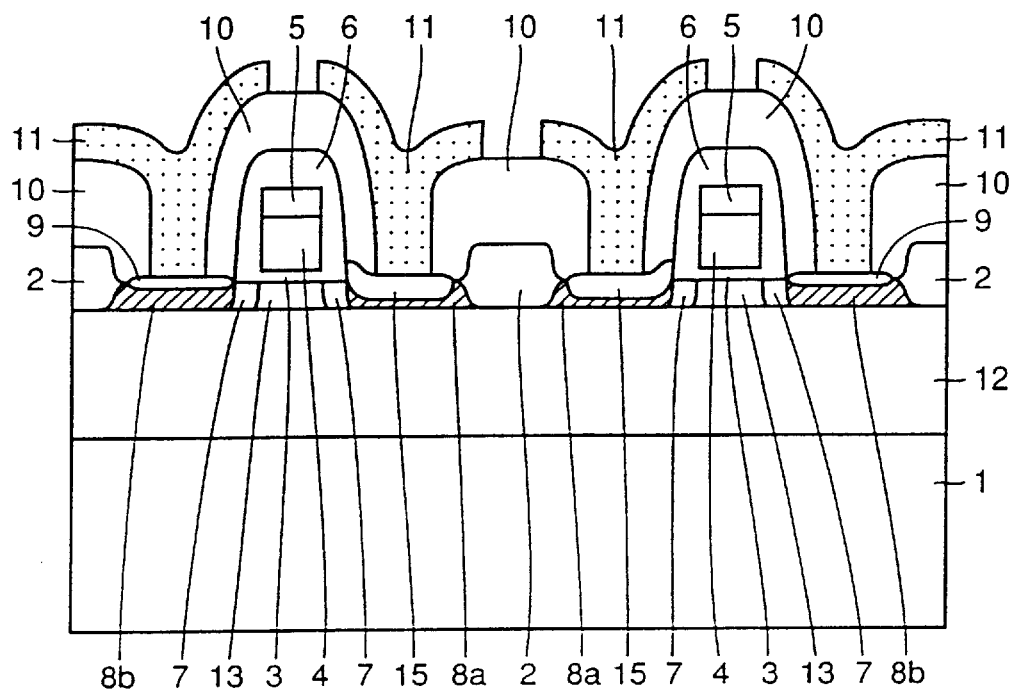
FIG. 20 is a cross section showing an SOI/MOS transistor in accordance with a fourth embodiment of the present invention.

Next, referring to FIG. 20, the structure of SOI/MOS transistor in accordance with a fourth embodiment will be described. In the fourth embodiment, a plurality of (2 in the figure) NMOS transistors are formed on the SOI substrate. In each MOS transistor, titanium silicide film 15 on the source side is made thicker than the titanium silicide film 9 on the drain side. Thickness of the titanium silicide film 15 on the source side is 500 to 800 Å, while the thickness of titanium silicide film 9 on the drain side is 100 to 600 Å.

Figure 21:
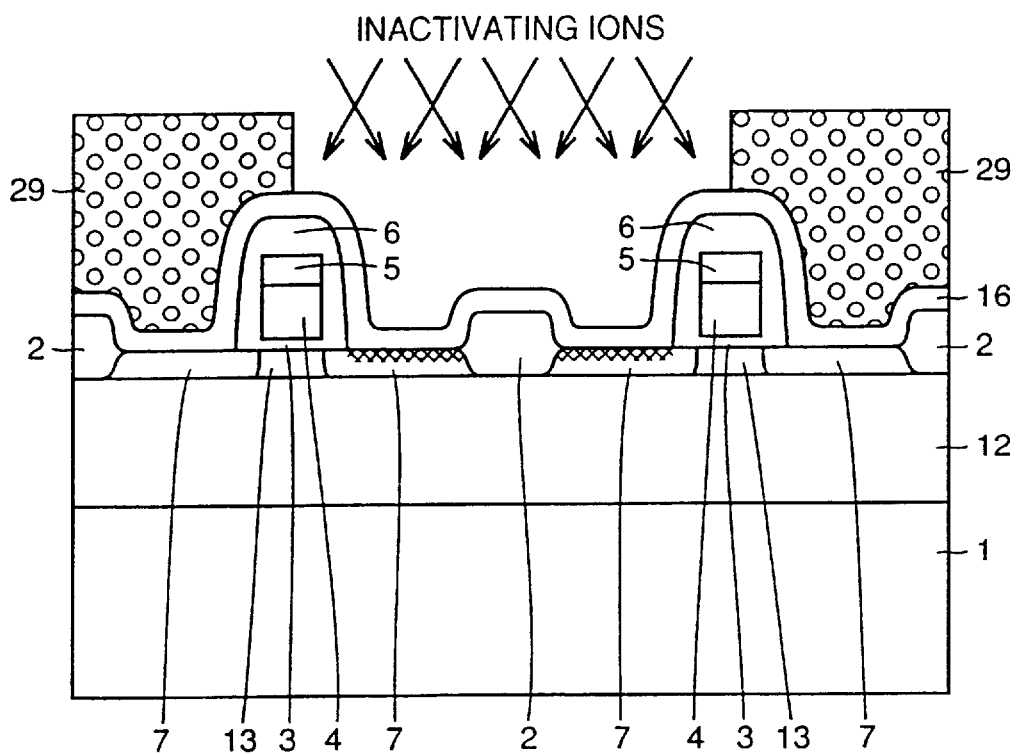
FIG. 21 is a cross section showing the process for manufacturing the SOI/MOS transistor in accordance with the fourth embodiment shown in FIG. 20.

The process for manufacturing the SOI/MOS transistor of the fourth embodiment will be described. The step shown in FIG. 21 corresponds to the manufacturing process of the second embodiment shown in FIG. 9, in which inactivating ions are implanted after deposition of titanium layer 16. A photoresist film 29 is formed to cover regions other than the source region of the MOS transistor, and using photoresist 29 as a mask, inactivating ions such as silicon ions are implanted by rotary oblique implantation with the angle of 30° to 45°. By this ion implantation, mixing at the titanium/silicon interface is performed, and therefore the reaction of silicidation takes place smoothly. Various conditions for silicidation and process steps following these steps are the same as those of the second embodiment.

Figure 22:
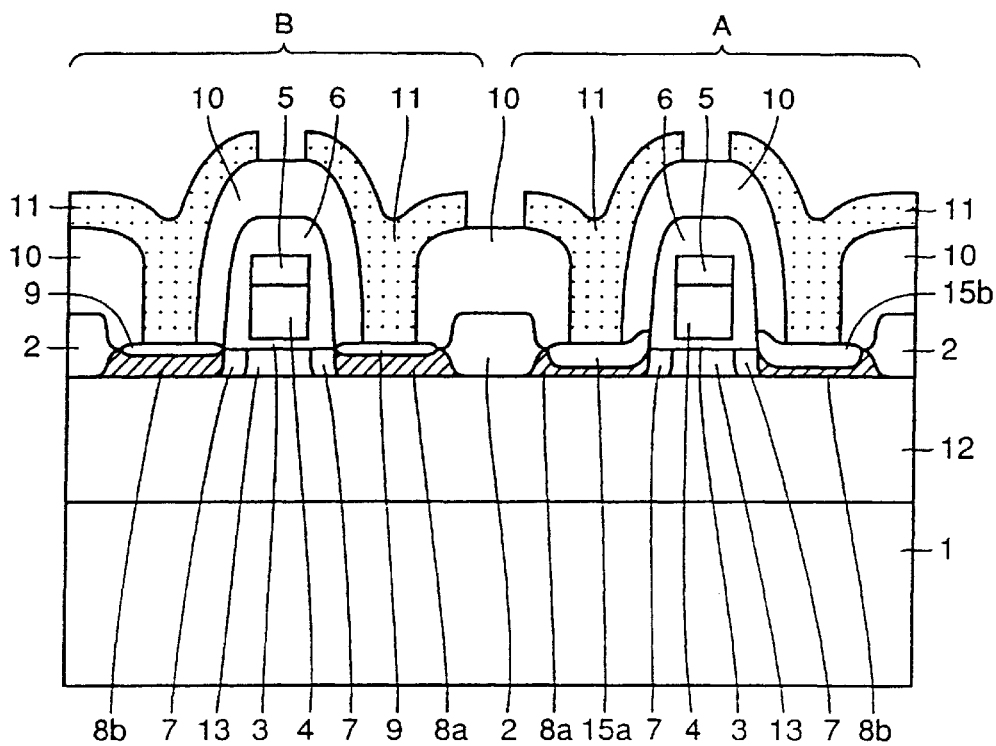
FIG. 22 is a cross section showing an SOI/MOS transistor in accordance with a fifth embodiment of the present invention.

The structure of an SOI/MOS transistor of a fifth embodiment will be described with reference to FIG. 22. In this fifth embodiment also, a plurality of NMOS transistors are formed on the SOI substrate. However, source/drain regions 8a and 8b of the NMOS transistor formed in the area A are both subjected to mixing. Therefore, different from the fourth embodiment, titanium silicide film 15 having the same thickness as the titanium silicide film 15 on the source side is formed on the drain side. When the titanium silicide film 15 on the source side should be distinguished from the titanium silicide film on the drain side, the titanium silicide film on the source side should be represented by 15a and the titanium silicide film on the drain side should be represented by 15b. The source/drain regions 8a and 8b of the NMOS transistor formed in area B are not subjected to mixing, and therefore titanium silicide film 9 which is thinner than titanium silicide film 15 is formed.

Figure 23:
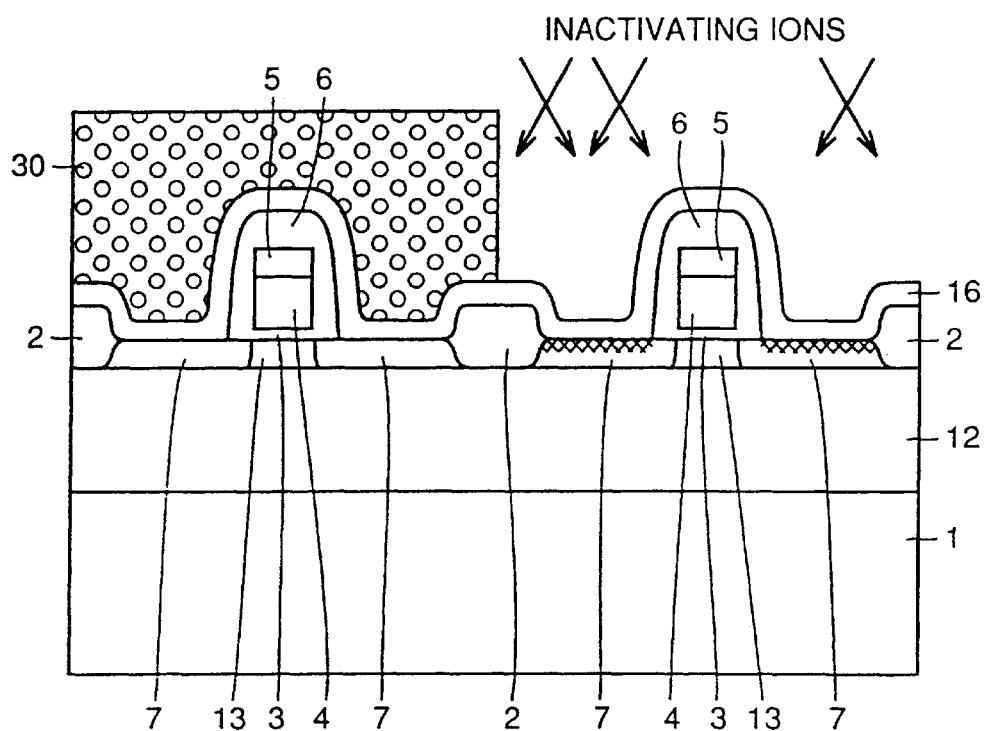
FIG. 23 is a cross section showing the process for manufacturing the SOI/MOS transistor in accordance with the fifth embodiment shown in FIG. 22.

The process for manufacturing the SOI/MOS transistor of the fifth embodiment will be described. FIG. 23 shows the process which corresponds to the manufacturing process of the second embodiment shown in FIG. 9. More specifically, the step of implanting inactivating ions after formation of titanium layer 16 is shown. However, in the manufacturing process of the fifth embodiment, photoresist 30 is formed only in the area B, and by using photoresist 30 as a mask, inactivating ions such as silicon ions are implanted by oblique rotary implantation with the angle of 30° to 45°, so that the crystal at the surface of the SOI layer 13 is damaged. This ion implantation causes mixing at the titanium/silicon interface, which enables smooth silicidation. Various conditions for silicidation and subsequent steps are the same as those of the second embodiment.

In this fifth embodiment, the thickness of titanium silicide film of the source/drain region can be made different in different MOS transistors. Therefore, source/drain regions having desired resistance values can be formed in every MOS transistor. In this case, for a transistor in which the parasitic resistance of the source/drain region should be lower than the parasitic resistance at the source/drain regions of other transistors, inactivating ions may be implanted. Since generation of crystal defects at the time of silicidation is suppressed by implantation of inactivating ions, leakage current derived from silicidation can be reduced. Namely, when leakage current at the source/drain region should be further suppressed than in other transistors, inactivating ions should be selectively implanted.

Figure 24:
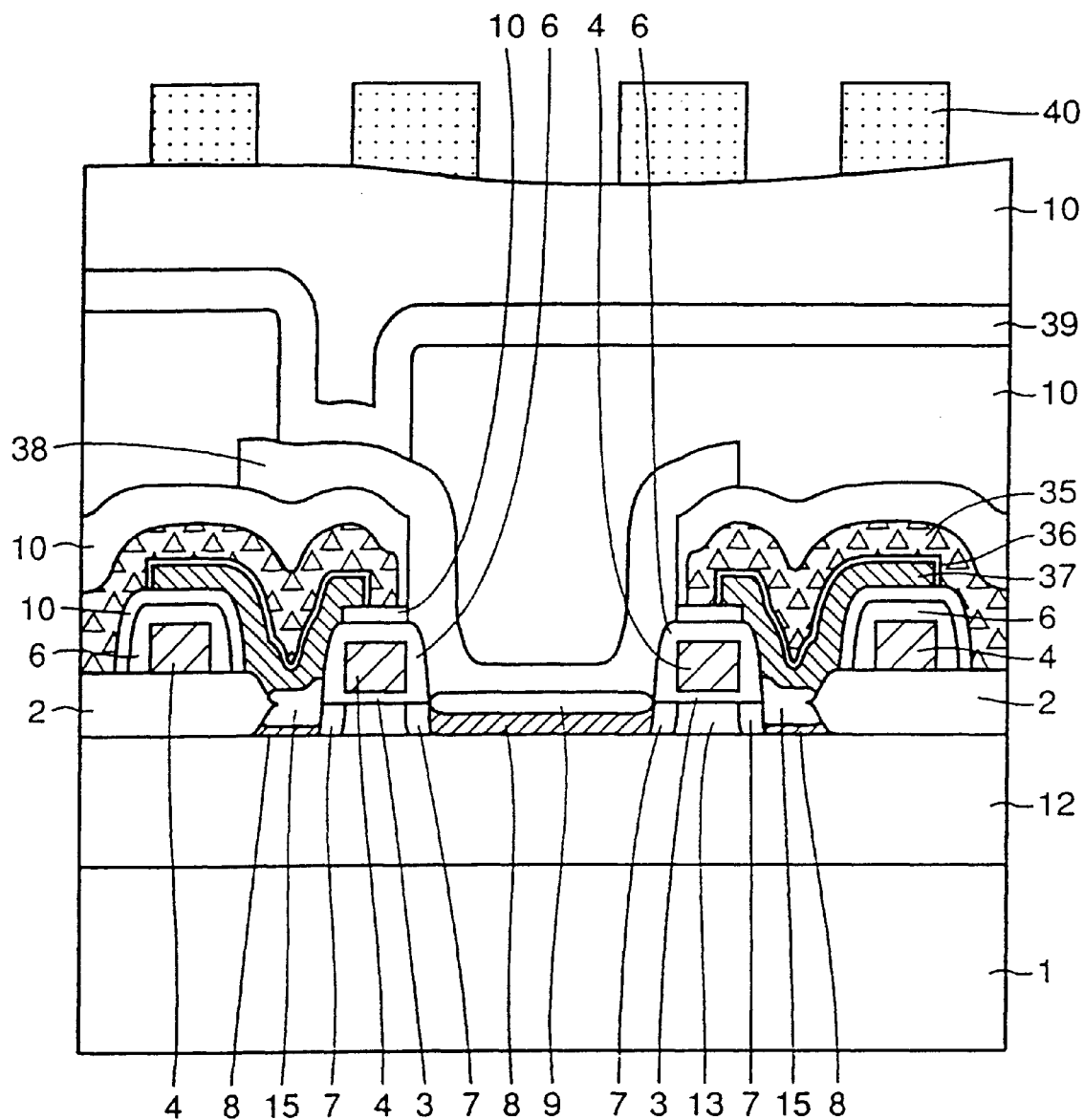
FIG. 24 is a cross section showing a DRAM device in accordance with a sixth embodiment of the present invention.

A structure of a DRAM element formed on SOI substrate in accordance with the sixth embodiment will be described with reference to FIG. 24. In the sixth embodiment, two transfer gate transistors sharing one of the source/drain regions 8 is formed on SOI layer 13. On the surface of the common source/drain region 8, a polysilicon pad 38 is formed with a titanium silicide film 9 interposed. On the other one of the source/drain regions 8, a storage node 37 serving as a lower electrode of a capacitor is formed, with a titanium silicide film 15 thicker than the titanium silicide film 9 interposed therebetween. On storage node 37, a cell plate 35 serving as a capacitor upper electrode is formed, with a capacitor insulating film 36 interposed. At one end of polysilicon pad 38, a bit line 39 having two layered structure of polysilicon layer and tungsten silicide layer is electrically connected. On the bit line 39, a reinforcing word line 40 of aluminum is formed spaced by a prescribed distance, with an interlayer insulating film 10 interposed. An interlayer insulating film 10 is also formed below the bit line 39.

In case of a DRAM, the regions corresponding to the source and drain regions in the MOS transistor are inverted dependent on whether the charges are stored in the memory cell or not. When charges are held in the capacitor side, generally, re-writing of charges is performed in order to prevent ejection of charges as leakage current to the polysilicon pad 38. In order to make longer the cycle of re-writing, it is necessary to reduce the leak current. Here, leakage current derived from crystal defects can be reduced by implanting inactivating ions so as to reduce generation of crystal defects at the time of silicidation. In the sixth embodiment, the thickness of titanium silicide film 15 on the capacitor side is made thicker by implanting inactivating ions only to the side of the capacitor. However, the titanium silicide film 9 may be formed thicker by implanting inactivating ions also on the side of the polysilicon pad 38.

Figure 25:
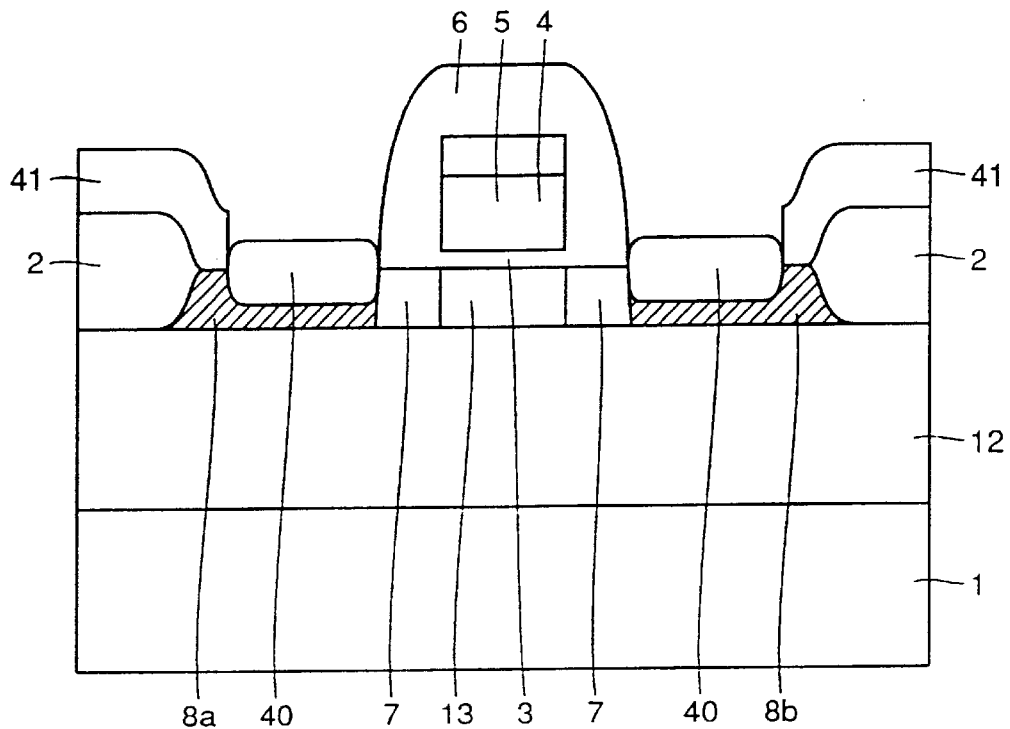
FIG. 25 is a cross section showing an SOI/MOS transistor in accordance with a seventh embodiment of the present invention.

A structure of an SOI/MOS transistor in accordance with a seventh embodiment will be described with reference to FIG. 25. In this seventh embodiment, a side edge of a titanium silicide film 40 having the thickness of 500 to 800 Å is adapted to be positioned spaced by a prescribed distance from an end portion of the element isolating oxide film 2. An oxide film 41 is formed on the element isolating oxide film 2 and on the region positioned between the element isolating oxide film 2 and the titanium silicide film 40.

Figure 26:
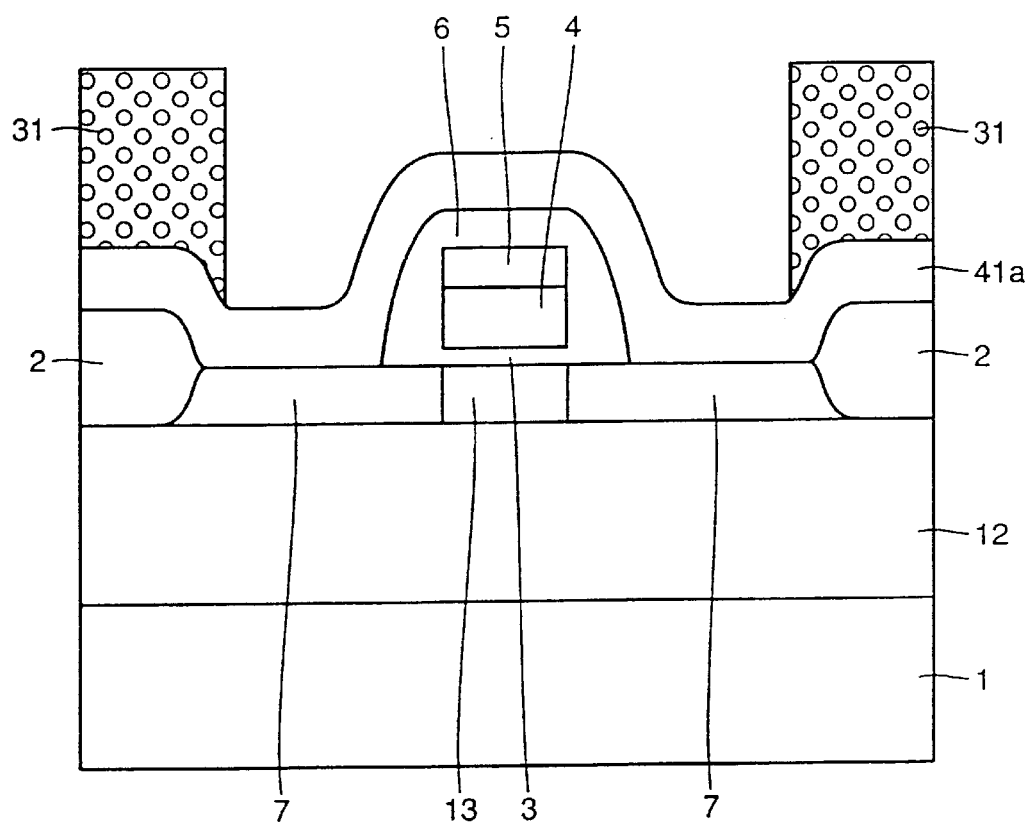
FIG. 26 is a cross section showing a first step of manufacturing the SOI/MOS transistor in accordance with the seventh embodiment of the present invention.
Figure 27:
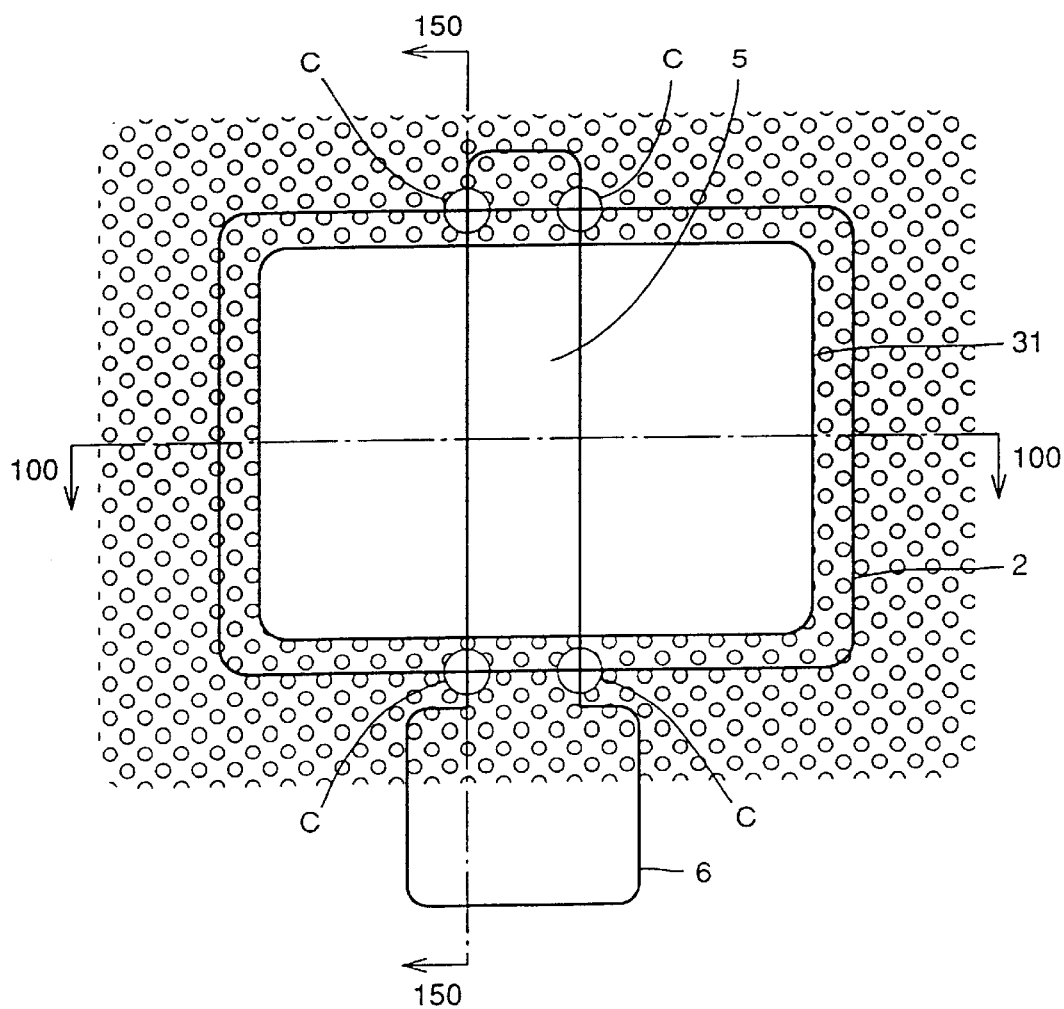
FIG. 27 is a plan view showing the second step of manufacturing the SOI/MOS transistor in accordance with the seventh embodiment shown in FIG. 25.
Figure 28:
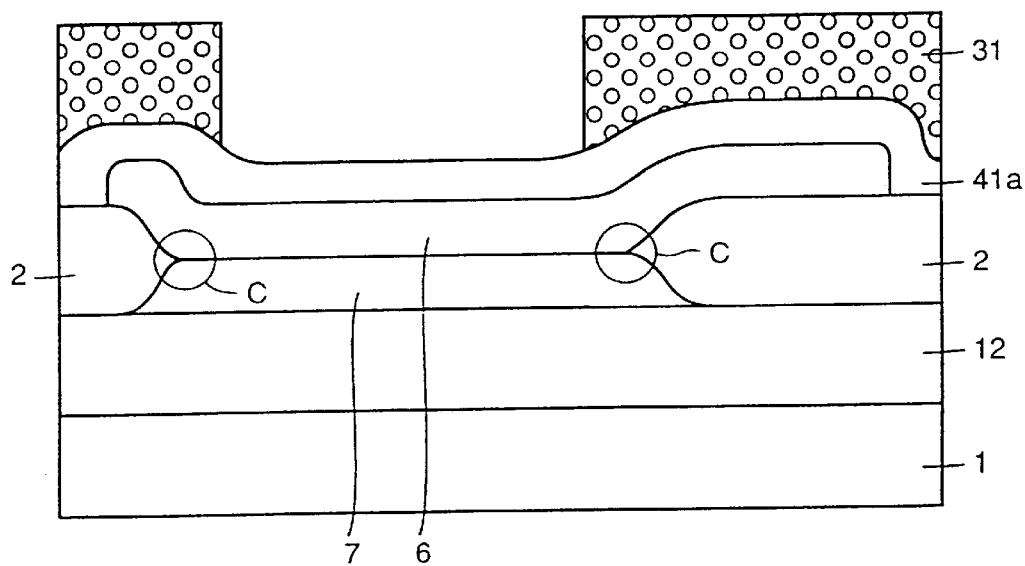
FIG. 28 is a cross section taken along the line 100—100 in the step shown in FIG. 27.

The process for manufacturing the SOI/MOS transistor of the seventh embodiment will be described. First, the same processes for manufacturing as shown in FIGS. 2 to 5 of the first embodiment are performed on the SOI substrate. Thereafter, an oxide film 41a is deposited to the thickness of about 2000 Å by reduced pressure CVD. Thereafter, by using a mask slightly smaller than the SOI layer 13, a photoresist 31 such as shown in FIG. 26 is provided. This mask is the one commonly used for forming a device such as DRAM, and it is not necessary to newly provide a mask for the aforementioned step. FIG. 27 is a plan view of the step shown in FIG. 26, and FIG. 26 is a cross section taken along the line 100—100 of FIG. 27. FIG. 28 is a cross section taken along the line 150—150 of FIG. 27.

Figure 29:
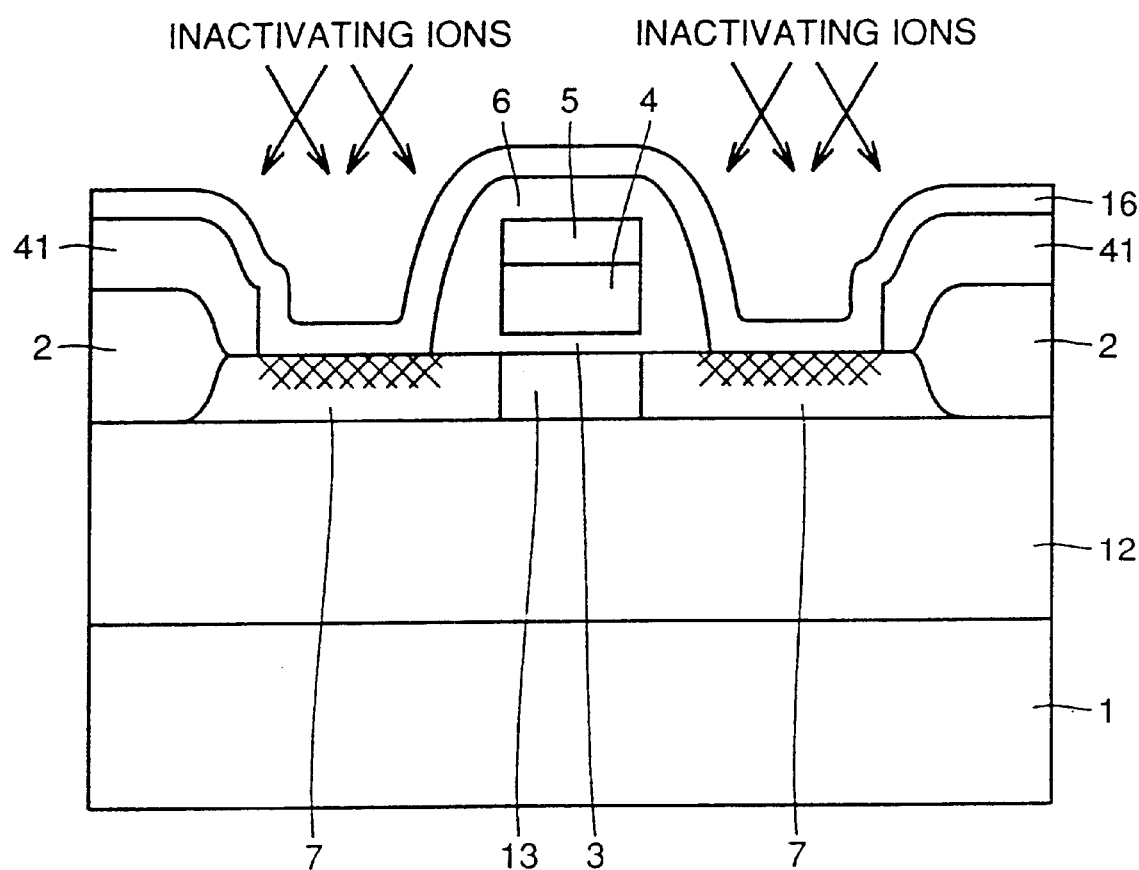
FIG. 29 is a cross section showing the third step of manufacturing the SOI/MOS transistor in accordance with the seventh embodiment shown in FIG. 25.

Thereafter, by using photoresist 31, oxide film 41a is patterned, and an oxide film 41 such as shown in FIG. 29 is formed. Thereafter, photoresist 31 is removed. Then, titanium layer 16 is deposited by sputtering, inactivating ions are implanted by oblique rotary implantation with the angle of 30° to 45°, thus mixing the silicon/titanium interface. Various conditions for forming optimal silicide film and subsequent process steps are the same as those of the second embodiment described above.

In the SOI/MOS transistor in accordance with the seventh embodiment, titanium silicide film 40 is not formed at the edge portion of element isolating oxide film 2. Therefore, titanium silicide film 40 is not formed at the cross point C of gate electrode 4 and element isolating oxide film 2, as shown in FIG. 27. Therefore, leakage current between source/drain can be prevented.

Figure 30:
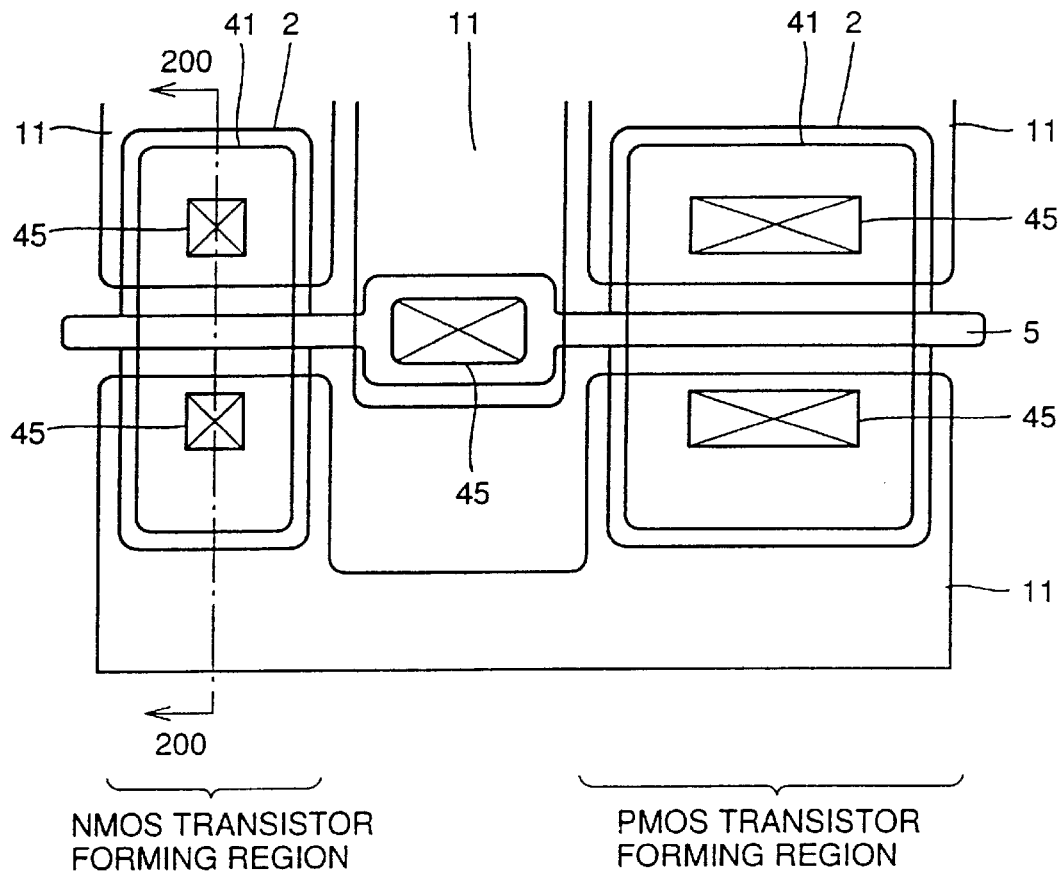
FIG. 30 is a plan view showing a CMOS inverter in accordance with an eighth embodiment of the present invention.
Figure 31:
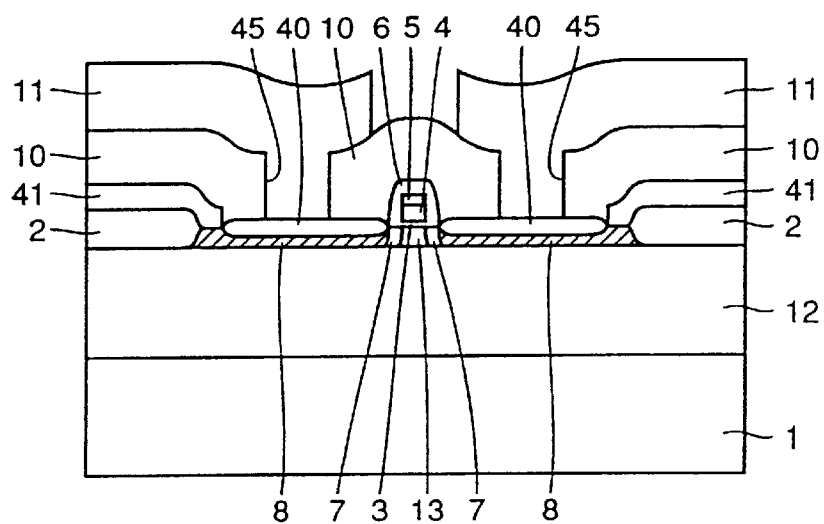
FIG. 31 is a cross section taken along the line 200—200 of the CMOS inverter in accordance with the eighth embodiment shown in FIG. 30.

A CMOS inverter of the eighth embodiment will be described with reference to FIGS. 30 and 31. FIG. 30 is a top view of the CMOS inverter in accordance with the eighth embodiment. FIG. 31 is a cross section taken along the line 200—200 of FIG. 30. In this eighth embodiment, contact holes 45 are provided in interlayer insulating film 10 for providing electrical connection between titanium silicide film 40 and aluminum interconnection 11. As in the seventh embodiment, the side edge of titanium silicide film 40 is formed spaced by a prescribed distance from the edge portion of element isolating oxide film 2.

Figure 32:
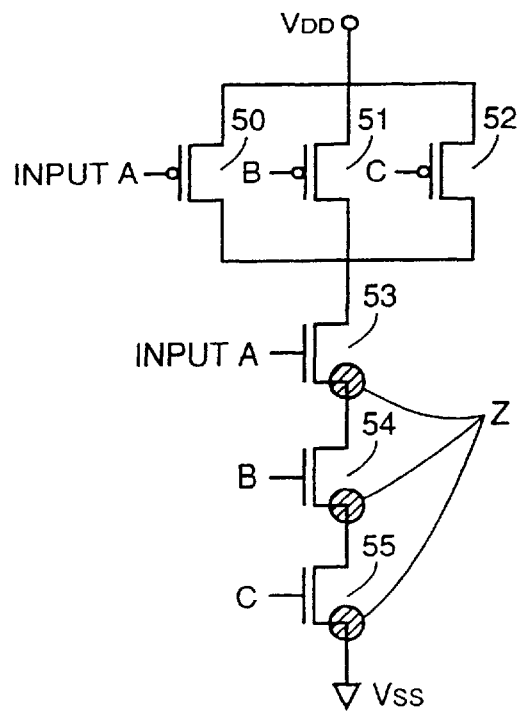
FIG. 32 is an equivalent circuit diagram of a 3-input NAND circuit in accordance with a ninth embodiment of the present invention.

Referring to FIG. 32, a structure of 3-input NAND circuit of a ninth embodiment will be described. The 3-input NAND circuit provides a second level for outputting when three input levels A, B and C are all at a first level. In the 3-input NAND circuit of the ninth embodiment, three PMOS transistors 50, 51 and 52 are connected in parallel, and three NMOS transistors 53, 54 and 55 are connected in series. To one end of each of PMOS transistors 50 to 52, power supply is connected. A potential of the power supply is represented by VDD. One end of NMOS transistor 55 is grounded. A potential of ground is represented by $V_{SS}$. In an example in which source/drain regions of each transistor are determined as in the NAND circuit, the silicide film is formed by implanting ions such as silicon only to the source region represented by the hatched region Z of FIG. 32. Consequently, NMOS transistors 53, 54 and 55 having thicker silicide films on the source region than the drain region can be formed.

Figure 33:
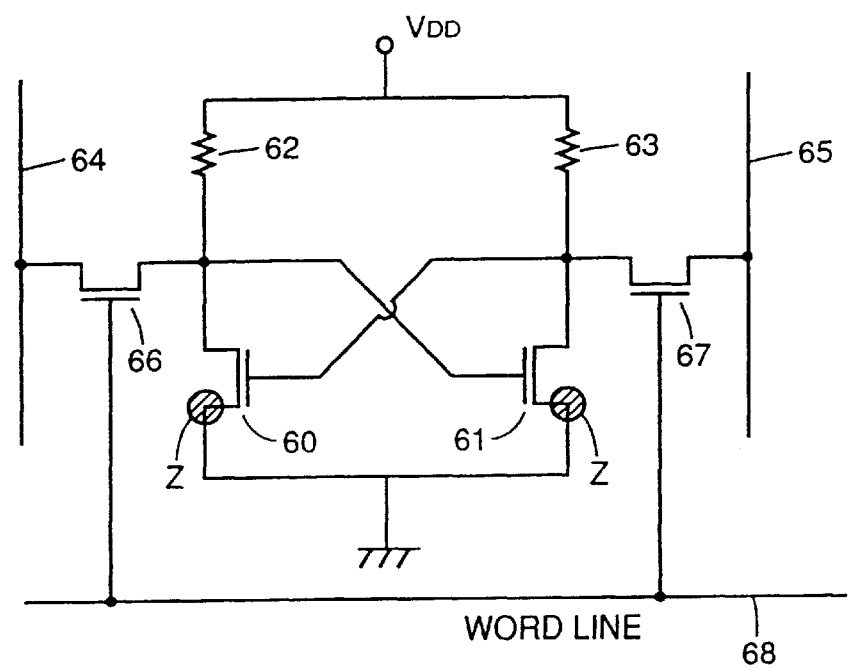
FIG. 33 is an equivalent circuit diagram of a high resistance load type SRAM cell in accordance with a tenth embodiment of the present invention.
Figure 34:
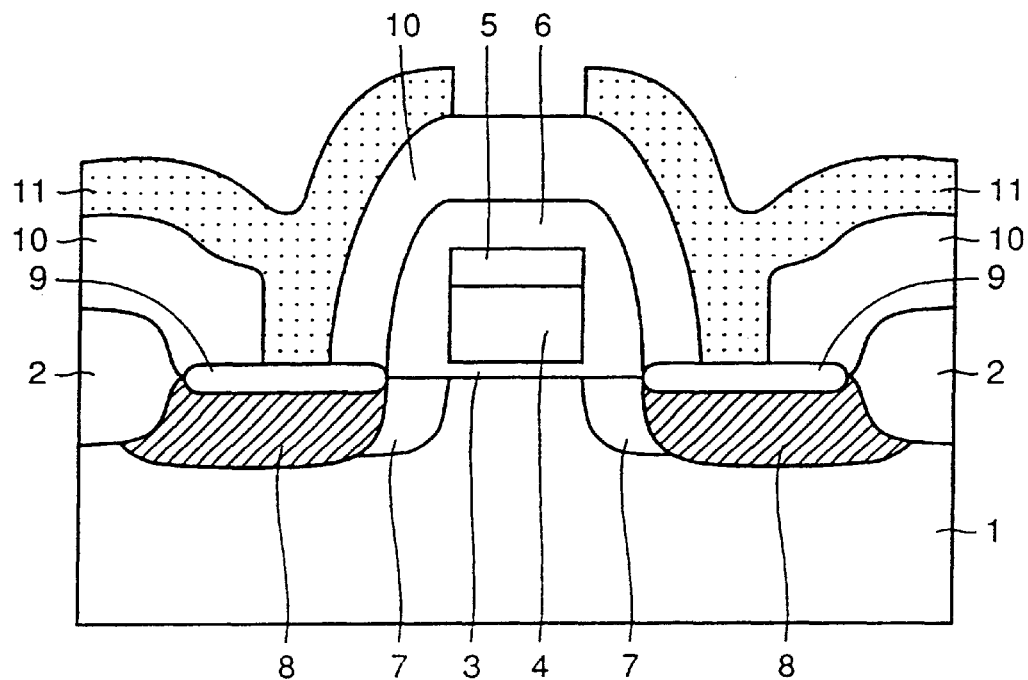
FIG. 34 is a cross section showing a conventional bulk MOS transistor.
Figure 35:
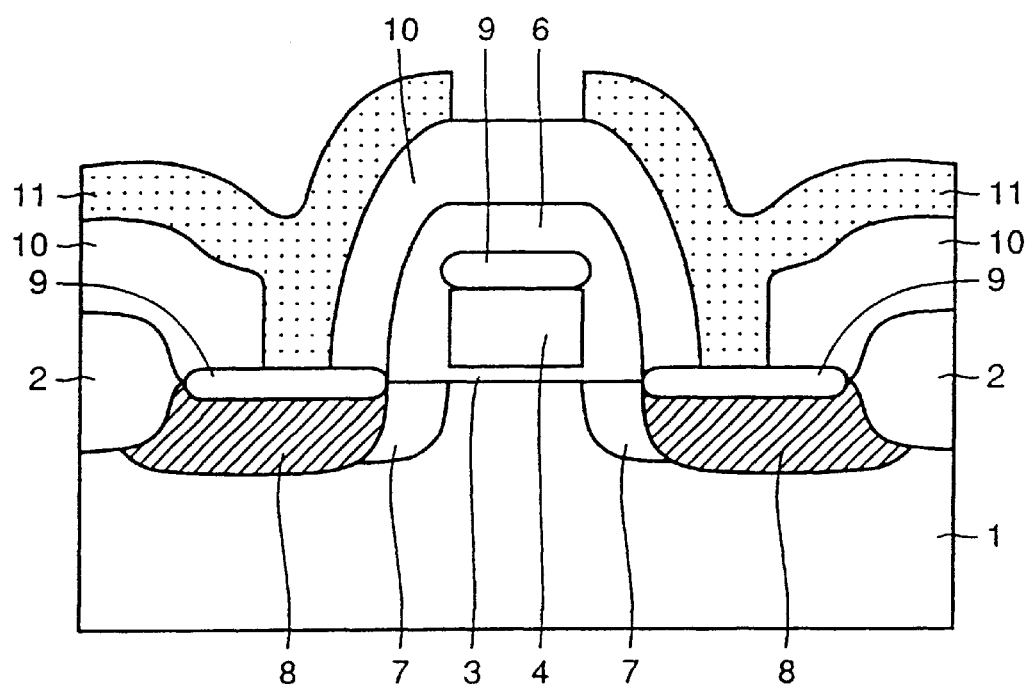
FIG. 35 is a cross section showing another conventional bulk MOS transistor.
Figure 36:
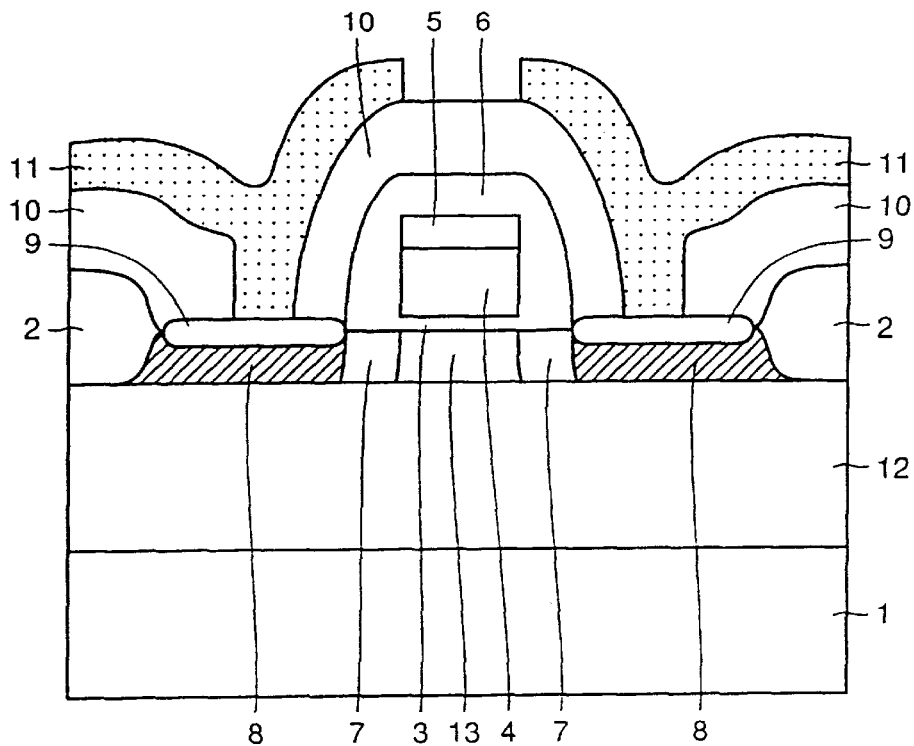
FIG. 36 is a cross section showing a conventional SOI/MOS transistor.
Figure 37:
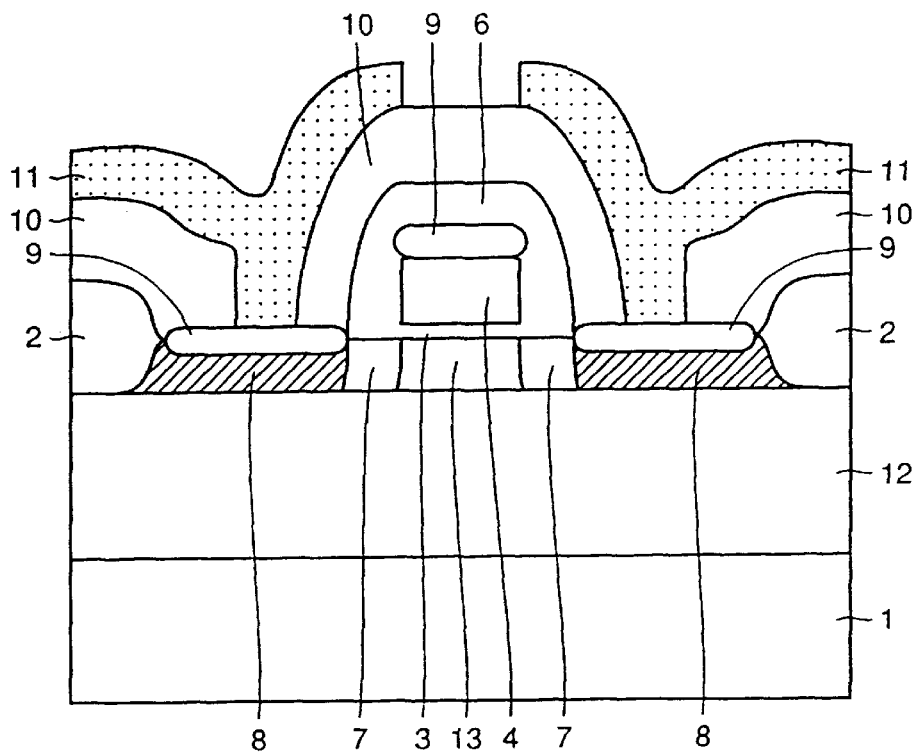
FIG. 37 is a cross section showing another conventional SOI/MOS transistor.

A high-resistance load type SRAM cell circuit of a tenth embodiment will be described with reference to FIG. 33. In this tenth embodiment, an SRAM memory cell is formed by two driver transistors 60 and 61 as well as two resistance elements 62 and 63. An access transistor 66 is connected to the node between resistance element 62 and driver transistor 60, and access transistor 67 is connected to the node between resistance element 63 and driver transistor 61. A word line 68 is connected to the gates of access transistors 66 and 67. A bit line 64 is connected to one end of access transistor 66, and a complementary bit line 65 is connected to one end of access transistor 67. In the tenth embodiment, when the source and drain regions are determined as in driver transistors 60 and 61, thick silicide film may be formed by implanting ions, such as silicon, only to the source region represented by the hatching Z.

In the first to tenth embodiments above, silicidation using titanium have been described. However, the present invention is not limited thereto, and any material may be used provided that it provides metal compound by the reaction with silicon. For example, cobalt silicide ($CoSi_2$), nickel silicide ($NiSi_2$), tantalum silicide ($TaSi_2$) may be used. Although NMOS transistor have been mainly described in the above embodiments, similar effect can be obtained in PMOS transistors also.

As described above, in the semiconductor device in accordance with the first aspect of the present invention, first and second silicide films of the same material but having different thicknesses exist in one semiconductor chip, and therefore the region on which the first silicide film is formed can have different resistance value than the region on which the second silicide film is formed.

In the semiconductor device in accordance with another aspect of the present invention, by making thicker the silicide film on the source region than the silicide film on the drain region, undesirable influence to the transistor derived from parasitic resistance which is more serious in the source region can be prevented and, in addition, the problem of punch through can be prevented since the silicide thickness in the drain region is the same as in the prior art and not made thicker. Further, when the silicide film on the source region of the semiconductor region formed on an insulating film is made thicker than the silicide film on the drain region, the holes accumulated in the substrate can be more easily ejected through the silicide film, and therefore rise in the substrate potential can be prevented.

In the semiconductor device in accordance with the further aspect of the present invention, leakage current generated at the edge portion of the element isolating insulating film can be prevented by forming a silicide film at a position in the element forming region, spaced by a prescribed distance from the element isolating insulating film.

In accordance with the method of manufacturing a semiconductor device in accordance with a still further aspect of the present invention, by implanting electrically inactivating ions to a region at which parasitic resistance should have low value, the single crystal silicon is turned to amorphous. Consequently, the stress at the silicide/silicon interface generated at the reaction of silicidation can be released, and therefore generation of crystal defects can be prevented and silicide film of superior quality can be obtained. Therefore, by selectively implanting electrically inactive ions, a silicide film which is thicker than in the prior art can be formed at a desired region. When rotary oblique implantation is utilized for implanting electrically inactive ions, the single crystal silicon can be turned into amorphous uniformly, and a silicide film of superior quality can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
    an element isolating insulating film formed in a semiconductor layer for surrounding an element forming region;
    a pair of source/drain regions formed in said element forming region, sandwiching a channel region;
    a gate electrode formed on a surface of said channel region with a gate insulating film interposed therebetween;
    a sidewall insulating film formed on and being in contact with a side surface of an outermost edge of said gate electrode in a length direction of said channel region; and
    a silicide film formed on surfaces of said source/drain regions; wherein
        said gate electrode and said sidewall insulating film extend from an upper region of said element forming region to an upper region of said element isolating insulating film, and
        said silicide film is not formed at least in a region adjacent said sidewall insulating film and said element isolating insulating film, and located outside of said sidewall insulating film.

2. The semiconductor device according to claim 1, wherein said suicide film is a metal suicide film.

3. The semiconductor device according to claim 1, wherein said semiconductor layer is formed on an insulating film.

4. The semiconductor device according to claim 3, wherein said suicide film is a metal suicide film.

* * * * *